US012763018B2

(12) United States Patent
Song et al.

(10) Patent No.: US 12,763,018 B2
(45) Date of Patent: Oct. 13, 2026

(54) DISPLAY APPARATUS

(71) Applicant: Samsung Display Co., Ltd., Yongin-Si (KR)

(72) Inventors: Hwayoung Song, Yongin-si (KR); Sunghwan Kim, Yongin-si (KR); Jihyun Ka, Yongin-si (KR); Soongi Kwon, Yongin-si (KR); Chanyoung Yang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/935,650

(22) Filed: Nov. 4, 2024

(65) Prior Publication Data

US 2025/0166565 A1 May 22, 2025

(30) Foreign Application Priority Data

Nov. 16, 2023 (KR) ........................ 10-2023-0159539
Jul. 11, 2024 (KR) ........................ 10-2024-0091819

(51) Int. Cl.

*G09G 3/3233* (2016.01)
*H10K 59/121* (2023.01)
*H10K 59/131* (2023.01)

(52) U.S. Cl.

CPC ....... *G09G 3/3233* (2013.01); *H10K 59/1213* (2023.02); *H10K 59/131* (2023.02); *G09G 2300/0408* (2013.01); *G09G 2300/0426* (2013.01); *G09G 2300/0819* (2013.01); *G09G 2300/0852* (2013.01); *G09G 2300/0861* (2013.01); *G09G 2310/08* (2013.01); *G09G 2320/045* (2013.01); *G09G 2340/0435* (2013.01)

(58) Field of Classification Search

CPC ............... G09G 3/3233; H10K 59/131; H10K 59/1213; H10K 59/126

See application file for complete search history.

(56) References Cited

U.S. PATENT DOCUMENTS 10,025,410 B2 7/2018 Kim et al.
2015/0084946 A1 3/2015 Shim et al.
2018/0061311 A1* 3/2018 Lin ...................... G09G 3/3291
2020/0184900 A1* 6/2020 Shin ..................... G09G 3/3233
2020/0226978 A1 7/2020 Lin et al.

(Continued)

FOREIGN PATENT DOCUMENTS

KR 10-2017-0073483 A 6/2017
KR 10-2074718 B1 2/2020

(Continued)

*Primary Examiner* — Kevin M Nguyen
(74) *Attorney, Agent, or Firm* — Innovation Counsel LLP

(57) ABSTRACT

A display apparatus is provided in which at least one pixel electrode in a plurality of pixels overlaps with a data line among a plurality of data lines. A data signal may be supplied to each of the plurality of pixels via the plurality of data lines once per one frame, and an initializing voltage is supplied to the pixel electrode in each of the plurality of pixels at least twice per one frame. A time taken for the data signal to be supplied to each of the plurality of pixels during one frame is less than or equal to a period during which the initializing voltage is supplied to the pixel electrode in each of the plurality of pixels during one frame.

20 Claims, 30 Drawing Sheets

(56) References Cited

U.S. PATENT DOCUMENTS

| | | | | |
|---|---|---|---|---|
| 2021/0027696 | A1* | 1/2021 | Kim | G09G 3/3233 |
| 2021/0202759 | A1* | 7/2021 | Lee | H10K 59/1213 |
| 2022/0077269 | A1 | 3/2022 | Lee et al. | |
| 2022/0208088 | A1* | 6/2022 | Kim | H10K 50/813 |
| 2022/0358881 | A1 | 11/2022 | Chae et al. | |
| 2023/0108865 | A1 | 4/2023 | Kim et al. | |
| 2023/0119632 | A1 | 4/2023 | Kwon et al. | |
| 2023/0306890 | A1 | 9/2023 | Cho et al. | |
| 2024/0054948 | A1 | 2/2024 | Kim et al. | |

FOREIGN PATENT DOCUMENTS

| | | | |
|---|---|---|---|
| KR | 10-2020-0087711 | A | 7/2020 |
| KR | 10-2022-0025449 | A | 3/2022 |
| KR | 10-2022-0033637 | A | 3/2022 |
| KR | 10-2022-0131414 | A | 9/2022 |
| KR | 10-2022-0151088 | A | 11/2022 |
| KR | 10-2023-0047282 | A | 4/2023 |
| KR | 10-2023-0056854 | A | 4/2023 |

* cited by examiner

DISPLAY APPARATUS

CROSS-REFERENCE TO RELATED APPLICATION

This application is based on and claims priority under 35 U.S.C. § 119 to Korean Patent Application No. 10-2023-0159539, filed on Nov. 16, 2023, and Korean Patent Application No. 10-2024-0091819, filed on Jul. 11, 2024, in the Korean Intellectual Property Office, the disclosures of which are incorporated by reference herein in their entireties.

BACKGROUND

1. Field

The present disclosure relates to a pixel and a display apparatus including the same.

2. Description of the Related Art

Recently, display apparatuses have been diversifying in their applications. Moreover, as display apparatuses have become thinner and lighter, their range of use has been expanding.

Given that display apparatuses are utilized in various ways, various methods may be used to design the shapes of display apparatuses, and the number of functions that display apparatuses provide has increased.

SUMMARY

The present disclosure may include a display apparatus having improved display quality. However, aspects of embodiments are not limited thereto, and the above characteristics do not limit the scope of embodiments according to the disclosure.

Additional aspects will be set forth in the description which follows and will be apparent from the description.

According to an embodiment, a display apparatus includes a plurality of pixels each including a pixel circuit and a pixel electrode connected to the pixel circuit, and a plurality of data lines respectively connected to the plurality of pixels. At least one pixel electrode in the plurality pixels may overlap with a data line among the plurality of data lines. A data signal may be supplied to each of the plurality of pixels via the plurality of data lines once per one frame, and an initializing voltage may be supplied to the pixel electrode in each of the plurality of pixels at least twice per one frame. A time taken for the data signal to be supplied to each of the plurality of pixels during one frame may be less than or equal to a period during which the initializing voltage is supplied to the pixel electrode in each of the plurality of pixels during one frame.

The plurality of data lines may include first data lines connected to pixels arranged in odd pixel rows and second data lines connected to pixels arranged in even pixel rows. In each pixel column, one of the first data lines and one of the second data lines may be arranged adjacent to each other.

The pixel circuit may include a driving transistor, a first transistor connected between a corresponding data line among the plurality of data lines and a gate electrode of the driving transistor, and a second transistor connected between the pixel electrode and an initializing voltage line to which the initializing voltage is supplied. The first transistor may be turned on in response to a first gate signal and transmit the data signal from the corresponding data line to a gate of the driving transistor, and the second transistor may be turned on in response to a second gate signal and transmit the initializing voltage to the pixel electrode.

The time taken for the data signal to be supplied to each of the plurality of pixels during one frame may be a time during which the first gate signal is supplied to first transistors of each of the plurality of pixels. The period during which the initializing voltage is supplied to the pixel electrode in each of the plurality of pixels during one frame may be a period during which the second gate signal is supplied to the second transistor of each of the plurality of pixels.

The driving transistor may include a lower gate electrode supplied with a driving voltage, an upper gate electrode supplied with a voltage corresponding to the data signal, and a semiconductor layer arranged between the lower gate electrode and the upper gate electrode.

The semiconductor layer of the driving transistor may include a silicon semiconductor.

The first transistor may include a lower gate electrode, an upper gate electrode connected to the lower gate electrode, and a semiconductor layer arranged between the lower gate electrode and the upper gate electrode.

The semiconductor layer of the first transistor may include an oxide semiconductor.

The lower gate electrode of the first transistor may be arranged between the upper gate electrode of the driving transistor and the semiconductor layer of the first transistor, and the upper gate electrode of the driving transistor may be arranged between the semiconductor layer of the driving transistor and the lower gate electrode of the first transistor.

The display apparatus may further include an electrode layer arranged on a same layer as the lower gate electrode of the first transistor and overlapping the upper gate electrode of the driving transistor.

The display apparatus may further include a first electrode layer arranged on a same layer as the lower gate electrode of the driving transistor, a second electrode layer arranged on a same layer as the upper gate electrode of the driving transistor and overlapping the first electrode layer, and a third electrode layer arranged on a same layer as the lower gate electrode of the first transistor and overlapping the second electrode layer. The first electrode layer and the third electrode layer may be supplied with the driving voltage.

According to an embodiment, a display apparatus includes a plurality of pixels, and each of the plurality of pixels includes a light-emitting device, a first transistor configured to output a driving current to the light-emitting device, a second transistor connected between a data line and the first transistor, and a third transistor connected between the light-emitting device and an initializing voltage line. The second transistor may be turned on in response to a first gate signal and transmit a data signal from the data line to a gate of the first transistor, and the third transistor may be turned on in response to a second gate signal and transmit an initializing voltage that is supplied from the initializing voltage line to an electrode of the light-emitting device. The first gate signal may be supplied to second transistor in each of the plurality of pixels once per one frame, and the second gate signal may be supplied to third transistor in each of the plurality of pixels at least twice per one frame. A time taken for the first gate signal to be supplied to the second transistor in each of the plurality of pixels during one frame may be less than or equal to a period during which the second gate signal is supplied to a third transistor in each of the plurality of pixels during one frame.

The display apparatus may further include first data lines connected to pixels arranged in odd pixel rows and second data lines connected to pixels arranged in even pixel rows. In each pixel column, one of the first data lines and one of the second data lines may be arranged adjacent to each other.

The first transistor may include a lower gate electrode supplied with a driving voltage, an upper gate electrode supplied with a voltage corresponding to the data signal that is supplied through the data line, and a semiconductor layer arranged between the lower gate electrode and the upper gate electrode.

The semiconductor layer of the first transistor may include a silicon semiconductor.

The second transistor may include a lower gate electrode, an upper gate electrode connected to the lower gate electrode, and a semiconductor layer arranged between the lower gate electrode and the upper gate electrode.

The semiconductor layer of the second transistor may include an oxide semiconductor.

The lower gate electrode of the second transistor may be arranged between the upper gate electrode of the first transistor and the semiconductor layer of the second transistor, and the upper gate electrode of the first transistor may be arranged between the semiconductor layer of the first transistor and the lower gate electrode of the second transistor.

The display apparatus may further include an electrode layer arranged on a same layer as the lower gate electrode of the second transistor and overlapping the upper gate electrode of the first transistor.

The display apparatus may further include a first electrode layer arranged on a same layer as the lower gate electrode of the first transistor, a second electrode layer arranged on a same layer as the upper gate electrode of the first transistor and overlapping the first electrode layer, and a third electrode layer arranged on a same layer as the lower gate electrode of the second transistor and overlapping the second electrode layer. The first electrode layer and the third electrode layer may be supplied with the driving voltage.

BRIEF DESCRIPTION OF THE DRAWINGS

The above and other aspects, features, and advantages of the present disclosure will become more apparent by reference to the following description taken in conjunction with the accompanying drawings.

DETAILED DESCRIPTION

Figure 1A:
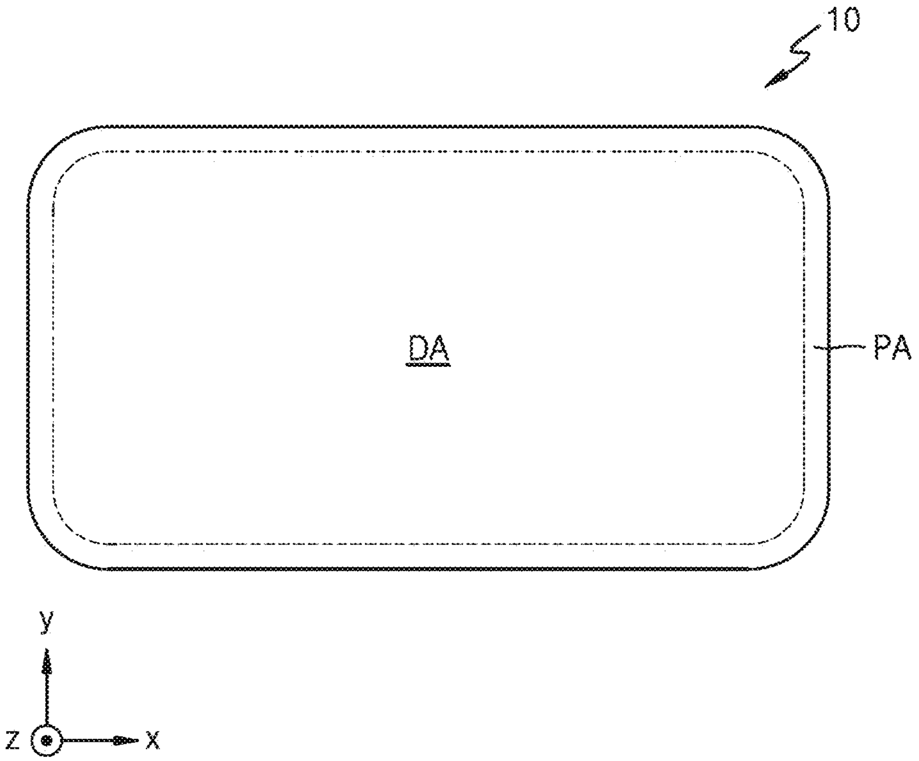
FIGS. 1A and 1B are schematic views of a display apparatus according to an embodiment.

Hereinafter, specific embodiments of the present disclosure are explained in detail with reference to the accompanying drawings. Like numerals refer to like elements throughout. In this regard, embodiments of the present disclosure may have different forms and should not be construed as being limited to the descriptions set forth herein. Accordingly, the embodiments are merely described below, by referring to the drawings, to explain aspects of the present disclosure. As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

As the present disclosure allows for various changes and can have numerous embodiments, particular embodiments will be illustrated in the drawings and described in detail in the written description. Hereinafter, effects and features of the present disclosure and a method for accomplishing them will be described more fully with reference to embodiments described below in detail with reference to the drawings. The present disclosure may, however, be embodied in many different forms and should not be construed as limited to the embodiments set forth herein.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

The terms "comprises" or "comprising" used herein specify the presence of stated features or components, but do not preclude the presence or addition of one or more other features or elements.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

When it is referred that X and Y are connected directly or indirectly, it may include the case where X and Y are physically connected, the case where X and Y are functionally connected, and the case where X and Y are electrically connected. The case where X and Y are indirectly connected may include a case where another element is interposed between X and Y and thus X and Y are indirectly connected. Here, X and Y may be elements (e.g., apparatuses, devices, circuits, wirings, electrodes, terminals, films, layers, and regions). Therefore, connection is not limited to preset connection relationship, for example, connection relationship shown in the drawings or detailed descriptions, and may include other connections relationships not shown in the drawings or detailed descriptions.

As used herein, when it is referred that X and Y are connected, it may mean that X and Y are electrically connected. The case where X and Y are electrically connected may include a case where X and Y are directly connected, or a case where another element is interposed between X and Y and thus X and Y are indirectly connected. The case where X and Y are indirectly connected may include a case where at least one device (e.g., a switch, a transistor, a capacitance element, an inductor, a resistance element, and a diode) that enables electrical connection between X and Y is connected between X and Y.

"ON" or "on" used in association with an element state may be referred to as an activated state of an element, and "OFF" or "off" may be referred to as an inactivated state of an element. "ON" or "on" used in association with a signal received by an element may be referred to as a signal for activating the element, and "OFF" or "off" may be referred to as a signal for inactivating the element. An element may be activated by a high-level voltage or a low-level voltage. For example, a P-channel transistor (P-type transistor) is activated by a low-level voltage, and an N-channel transistor (N-type transistor) is activated by a high-level voltage. Therefore, it should be understood that an "ON" voltage for a P-channel transistor and an "ON" voltage for an N-channel transistor have opposite (high versus low) voltage levels. Hereinafter, a voltage that activates (turns on) a transistor is referred to as a gate-on voltage, and a voltage that deactivates (turns off) a transistor is referred to as a gate-off voltage.

Figure 1B:
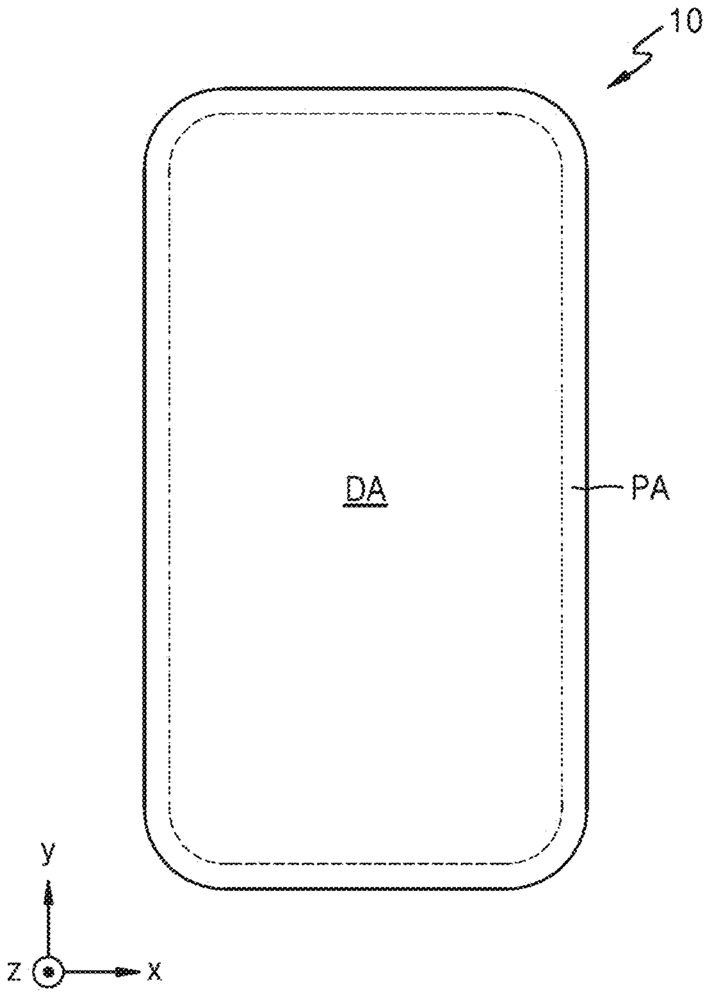
Figure 2:
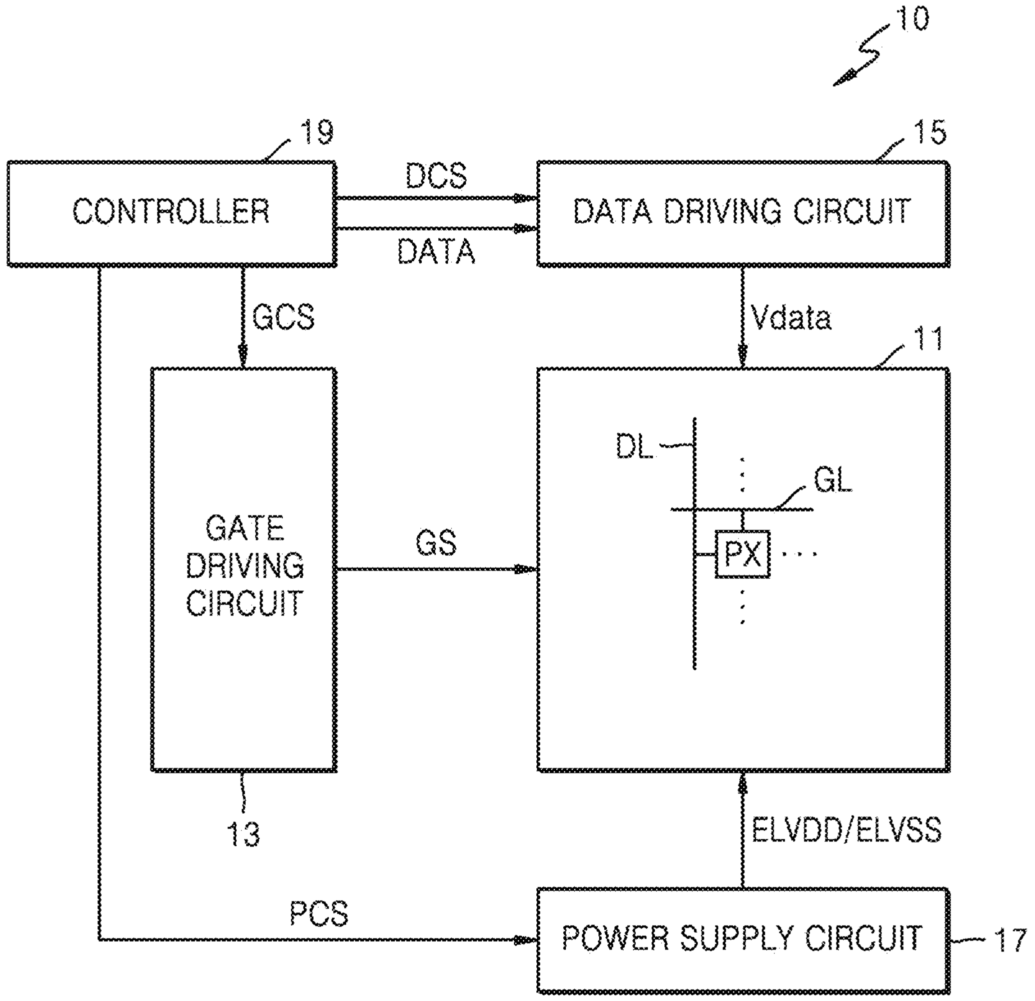
FIG. 2 is a schematic block diagram of a display apparatus according to an embodiment.

FIGS. 1A and 1B are schematic views of a display apparatus 10 according to an embodiment. FIG. 2 is a schematic block diagram of the display apparatus 10 according to an embodiment.

Referring to FIGS. 1A and 1B, the display apparatus 10 may include a display area DA displaying an image and a peripheral area PA around the display area DA. The display area DA may be entirely surrounded by the peripheral area PA.

When viewing the display area DA in a plane view, the display area DA may have a rectangular shape. According to an embodiment, the display area DA may have a polygonal shape (e.g., a triangular shape, a pentagonal shape, or a hexagonal shape), a circular shape, an elliptical shape, an irregular shape, or the like. The display area DA may have rounded corners. According to an embodiment, the display apparatus 10 may have a display area DA having a shape in which a length in an x direction is greater than a length in a y direction, as shown in FIG. 1A. According to an embodiment, the display apparatus 10 may have a display area DA having a shape in which a length in the y direction is greater than a length in the x direction, as shown in FIG. 1B.

Referring to FIG. 2, the display apparatus 10 according to an embodiment may include a pixel area 11, a gate driving circuit 13, a data driving circuit 15, a power supply circuit 17, and a controller 19.

The pixel area 11 may be included in the display area DA. Various conductive lines for transmitting electric signals to the display area DA, external circuits electrically connected to pixel circuits, and pads to which a printed circuit board (PCB) or a driver integrated circuit (IC) chip is attached may be located in the peripheral area PA. For example, the gate driving circuit 13, the data driving circuit 15, the power supply circuit 17, and the controller 19 may be disposed in the peripheral area PA.

As shown in FIG. 2, a plurality of gate lines GL, a plurality of data lines DL, and a plurality of pixels PX connected thereto may be disposed in the display area DA. The plurality of pixels PX may be arranged in any of various configurations, such as a stripe configuration, a PenTile configuration, a diamond configuration, and a mosaic configuration, to display an image. Each of the plurality of pixels PX may include an organic light-emitting diode OLED as a display element (light-emitting device), and the organic light-emitting diode OLED may be connected to a pixel circuit. The pixel circuit may include a plurality of transistors and at least one capacitor. Each of the plurality of pixels PX may emit, for example, red light, green light, blue light, or white light, via the organic light-emitting diode OLED. Each of the plurality of pixels PX may be connected to at least one corresponding gate line among the plurality of gate lines GL and a corresponding data line among the plurality of data lines DL.

Each of the gate lines GL may extend in the x direction (row direction) and may be connected to pixels PX arranged in the same row. Each of the gate lines GL may transfer a gate signal to the pixels PX in the same row. Each of the data lines DL may extend in the y direction (column direction) and may be connected to pixels PX arranged in the same column. Each of the data lines DL may transfer data signals to the pixels PX in the same column in response to the gate signals.

According to an embodiment, the peripheral area PA may be a non-display area in which no pixels PX are disposed. According to an embodiment, a plurality of pixels PX may be arranged in a portion of the peripheral area PA. For example, the plurality of pixels PX may be arranged at least one corner of the peripheral area PA and may overlap the gate driving circuit 13. Accordingly, a non-display area may be reduced, and the display area DA may be expanded.

The gate driving circuit 13 may be connected to the plurality of gate lines GL, may generate a gate signal according to a control signal GCS transmitted from the controller 19, and may sequentially supply the gate signal to the plurality of gate lines GL. The gate line GL may be electrically connected to a gate of a transistor included in a pixel PX. The gate signal may be a gate control signal for controlling turn-on and turn-off operations of a transistor whose gate is connected to a gate line GL. The gate signal may be a signal including a gate on-voltage for turning on a transistor and a gate off-voltage for turning off the transistor.

Although a pixel PX is illustrated as being connected to one gate line GL in FIG. 2, the present disclosure is not limited thereto. The pixel PX may be connected to two or more gate lines, and the gate driving circuit 13 may supply two or more gate signals, each of which has different timing of the gate on-voltage, to the corresponding gate lines.

The data driving circuit 15 may be connected to the plurality of data lines DL and may supply data signals Vdata to the data lines DL according to a control signal DCS received from the controller 19. A data signal Vdata supplied to a data line DL may be supplied to a pixel PX to which a gate signal GS has been supplied. The data driving circuit 15 may convert a data signal DATA received from the controller 19 and having a gray level into a data signal Vdata in the form of voltage or current.

The power supply circuit 17 may generate voltages necessary for driving the pixels PX in response to the control signal PCS from the controller 19. The power supply circuit 17 may generate a first driving voltage ELVDD and a second driving voltage ELVSS and supply them to the pixels PX. The first driving voltage ELVDD may be a high-level voltage that is provided to a driving transistor connected to a first electrode (i.e., a pixel electrode or an anode) of a display element included in the pixel PX. The second driving voltage ELVSS may be a low-level voltage that is provided to a second electrode (i.e., an opposite electrode or a cathode) of the display element included in the pixel PX.

The controller 19 may generate control signals GCS, DCS, and PCS, based on signals input from the outside, and may supply them to the gate driving circuit 13, the data driving circuit 15, and the power supply circuit 17. The control signal GCS output to the gate driving circuit 13 may include a plurality of clock signals and a gate start signal. The control signal DCS output to the data driving circuit 15 may include a data start signal and clock signals.

The display apparatus 10 may include a display panel, and the display panel may include a substrate. The pixels PX may be disposed in the display area DA of the substrate. A portion or the entirety of the gate driving circuit 13 may be directly formed in the peripheral area PA of the substrate during a process of forming transistors that make up the pixel circuit in the display area DA of the substrate. The data driving circuit 15, the power supply circuit 17, and the controller 19 may be formed as separate IC chips, respectively, or may be formed as a single IC chip, and may be disposed on a flexible printed circuit board (FPCB) electrically connected to a pad which is formed on one side of the substrate. According to an embodiment, the data driving circuit 15, the power supply circuit 17, and the controller 19 may be directly disposed on the substrate by using a chip on glass (COG) or chip on plastic (COP) method.

Figure 3:
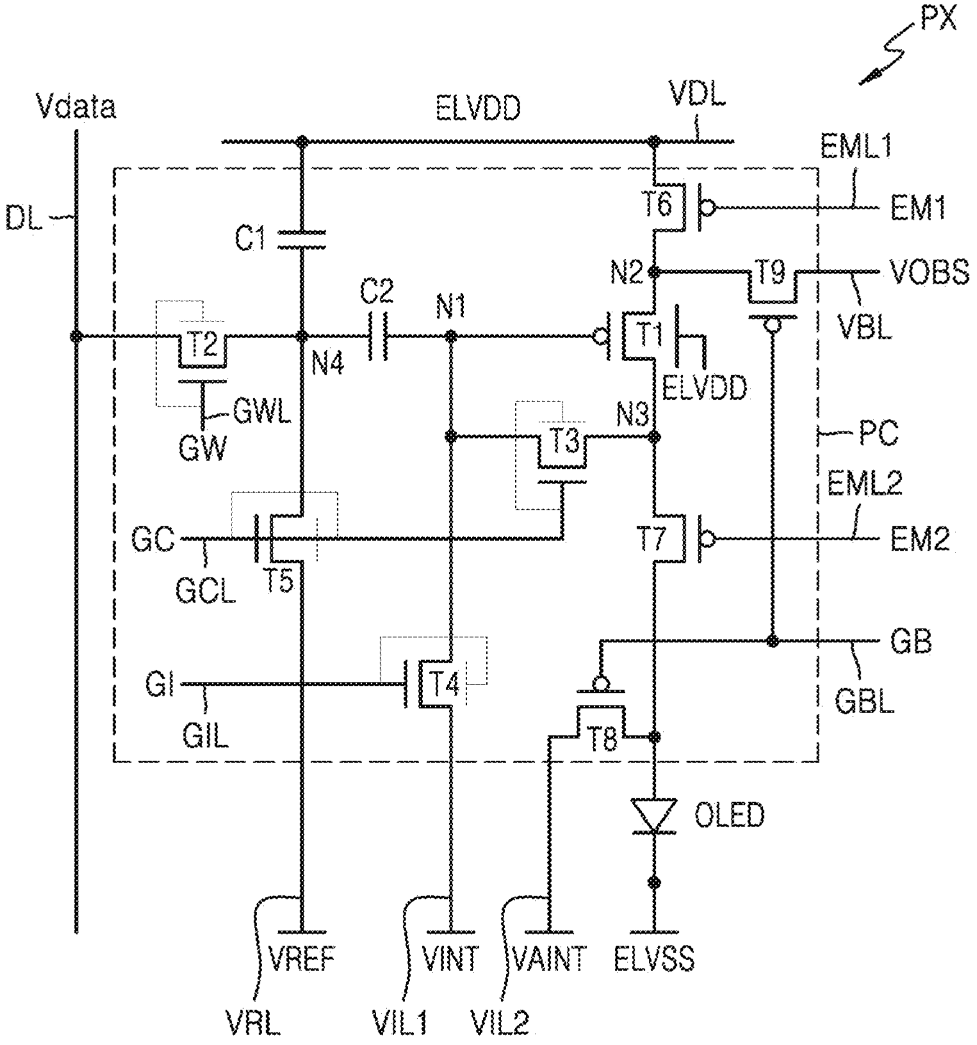
FIG. 3 is an equivalent circuit diagram of a pixel according to an embodiment.

FIG. 3 is an equivalent circuit diagram of a pixel PX according to an embodiment.

Referring to FIG. 3, the pixel PX may include a pixel circuit PC, and an organic light-emitting diode OLED as a display element connected to the pixel circuit PC.

The pixel circuit PC may include first, second, third, fourth, fifth, sixth, seventh, eighth, and ninth transistors T1, T2, T3, T4, T5, T6, T7, T8, and T9, a first capacitor C1, and a second capacitor C2. Signal lines connected to the pixel circuit PC may include a data line DL, a first gate line GWL, a second gate line GIL, a third gate line GCL, a fourth gate line EML1, a fifth gate line EML2, a sixth gate line GBL, a driving voltage line VDL, a reference voltage line VRL, a first initializing voltage line VIL1, a second initializing voltage line VIL2, and a bias voltage line VBL.

The first transistor T1 may be a driving transistor in which the magnitude of a source-drain current is determined according to a gate-source voltage, and the second through ninth transistors T2 through T9 may be switching transistors that are turned on or turned off in response to the gate-source voltage, which will be a gate voltage of each of the second through ninth transistors T2 through T9. The first through ninth transistors T1 through T9 may be implemented as thin-film transistors. According to the type (P-type or N-type) of transistor or operating conditions thereof, a first terminal of each of the first through ninth transistors T1 through T9 may be a source or a drain, and a second terminal thereof may be a different terminal than the first terminal. For example, when the first terminal is a source, the second terminal may be a drain.

The second through fifth transistors T2 through T5 may be N-channel transistors, and the first transistor T1 and the sixth through ninth transistors T6 through T9 may be P-channel transistors. According to an embodiment, the P-channel transistor may be a silicon thin-film transistor including a silicon semiconductor, and the N-channel transistor may be an oxide thin-film transistor including an oxide semiconductor.

The silicon semiconductor of the silicon thin-film transistor may include amorphous silicon, polysilicon, or the like. The oxide semiconductor of the oxide thin-film transistor may include oxide such as amorphous Indium-Gallium-Zinc-Oxide (IGZO), Zinc-Oxide (ZnO), or Titanum Oxide (TiO).

A gate-on voltage of a gate signal for turning on an N-channel transistor may be a high level voltage (first level voltage), and a gate-off voltage of a gate signal for turning off the N-channel transistor may be a low level voltage (second level voltage). A gate-on voltage of a gate signal for turning on a P-channel transistor may be a low level voltage (second level voltage), and a gate-off voltage of a gate signal for turning off the P-channel transistor may be a high level voltage (first level voltage).

The first transistor T1 may be connected between the driving voltage line VDL and the organic light-emitting diode OLED. The first transistor T1 may be connected to the driving voltage line VDL through the sixth transistor T6, and may be connected to the organic light-emitting diode OLED through the seventh transistor T7. The first transistor T1 may include a gate connected to a first node N1, a first terminal connected to a second node N2, and a second terminal connected to a third node N3. The first transistor T1 may supply, to the organic light-emitting diode OLED, a driving current corresponding to a voltage applied to the first node N1 according to a switching operation of the second transistor T2. According to an embodiment, the first transistor T1 may be a dual gate transistor which further includes a back gate to which a first driving voltage ELVDD is supplied. The back gate may be positioned to face the gate with a semiconductor of the first transistor T1 interposed therebetween. The back gate may be a lower gate disposed below the semiconductor, and the gate may be an upper gate disposed over the semiconductor.

The second transistor T2 may be connected between the data line DL and a fourth node N4. The second transistor T2 may include a gate connected to the first gate line GWL, a first terminal connected to the data line DL, and a second terminal connected to the fourth node N4. The second transistor T2 may be turned on in response to the first gate signal GW received through the first gate line GWL, and thus may transmit the data signal Vdata received through the data line DL to the fourth node N4.

The third transistor T3 may be connected between the first node N1 and the third node N3. The third transistor T3 may include a gate connected to the third gate line GCL, a first terminal connected to the third node N3, and a second terminal connected to the first node N1. When the third transistor T3 is turned on in response to the third gate signal GC received through the third gate line GCL, the first transistor T1 may be diode-connected. When the first transistor T1 is diode-connected, a threshold voltage of the first transistor T1 may be compensated for.

The fourth transistor T4 may be connected between the first node N1 and the first initializing voltage line VIL1. The fourth transistor T4 may include a gate connected to the second gate line GIL, a first terminal connected to the first node N1, and a second terminal connected to the first initializing voltage line VIL1. The fourth transistor T4 may be turned on in response to the second gate signal GI received through the second gate line GIL and transmit the first initializing voltage VINT to the first node N1 to initialize the gate of the first transistor T1.

The fifth transistor T5 may be connected between the fourth node N4 and the reference voltage line VRL. The fifth transistor T5 may include a gate connected to the third gate line GCL, a first terminal connected to the fourth node N4, and a second terminal connected to the reference voltage line VRL. The gate of the fifth transistor T5 may be connected to the gate of the third transistor T3 by the third gate line GCL. The fifth transistor T5 may be turned on in response to the third gate signal GC received through the third gate line GCL and transmit a reference voltage VREF to the fourth node N4.

According to an embodiment, each of the second transistor T2, the third transistor T3, the fourth transistor T4, and the fifth transistor T5 may be a dual gate transistor which further includes a back gate. The back gate (lower gate) may be disposed to face the gate (upper gate) with a semiconductor interposed therebetween, and may be connected to the gate, to receive the same gate signal.

The sixth transistor T6 may be connected between the driving voltage line VDL and the second node N2. The seventh transistor T7 may be connected between the third node N3 and the organic light-emitting diode OLED. The sixth transistor T6 may include a gate connected to the fourth gate line EML1, a first terminal connected to the driving voltage line VDL, and a second terminal connected to the second node N2. The seventh transistor T7 may include a gate connected to the fifth gate line EML2, a first terminal connected to the third node N3, and a second terminal connected to a pixel electrode of the organic light-emitting diode OLED. When the sixth transistor T6 is turned on in response to a fourth gate signal EM1 received through the fourth gate line EML1 and at the same time the seventh transistor T7 is turned on in response to a fifth gate signal EM2 received through the fifth gate line EML2, the driving current may flow in the organic light-emitting diode OLED.

The eighth transistor T8 may be connected between the organic light-emitting diode OLED and the second initializing voltage line VIL2. The eighth transistor T8 may include a gate connected to the sixth gate line GBL, a first terminal connected to the second terminal of the seventh transistor T7 and the pixel electrode of the organic light-emitting diode OLED, and a second terminal connected to the second initializing voltage line VIL2. The eighth transistor T8 may be turned on in response to a sixth gate signal GB received through the sixth gate line GBL and transmit the second initializing voltage VAINT to the pixel electrode of the organic light-emitting diode OLED to initialize the pixel electrode of the organic light-emitting diode OLED.

The ninth transistor T9 may be connected to the second node N2 and may supply the bias voltage VOBS to the first terminal of the first transistor T1. The ninth transistor T9 may include a gate connected to the sixth gate line GBL, a first terminal connected to the bias voltage line VBL, and a second terminal connected to the first terminal of the first transistor T1. The ninth transistor T9 may be turned on in response to the sixth gate signal GB received through the sixth gate line GBL and may transmit a bias voltage VOBS received through the bias voltage line VBL to the first terminal of the first transistor T1. The ninth transistor T9 may control the gate-source voltage of the first transistor T1 to compensate for a change in the current characteristics of the first transistor T1.

A first capacitor C1 may be connected between the driving voltage line VDL and the fourth node N4. The first capacitor C1 may store a voltage corresponding to a voltage difference between the driving voltage line VDL and the fourth node N4. The first capacitor C1 may store the data signal Vdata written through the second transistor T2.

A second capacitor C2 may be connected between the first node N1 and the fourth transistor N4. The second capacitor C2 may store a voltage corresponding to a voltage difference between the first node N1 and the fourth transistor N4.

The organic light-emitting diode OLED may include the pixel electrode (e.g., an anode) and an opposite electrode (e.g., a cathode) facing the pixel electrode, and the opposite electrode may receive the second driving voltage ELVSS. The organic light-emitting diode OLED may receive the driving current corresponding to the data signal Vdata from the first transistor T1 and emit light in a certain color, thereby displaying an image.

According to an embodiment, a plurality of transistors included in a pixel circuit may be P-channel transistors. According to an embodiment, a plurality of transistors included in a pixel circuit may be N-channel transistors.

Figure 4A:
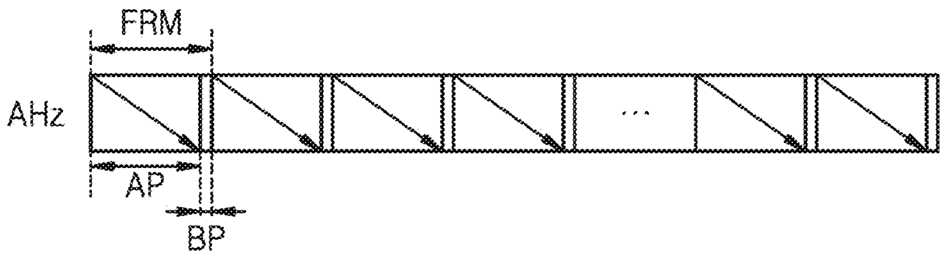
FIGS. 4A and 4B are conceptual diagrams for explaining a driving scheme of a display apparatus according to an embodiment.
Figure 4B:
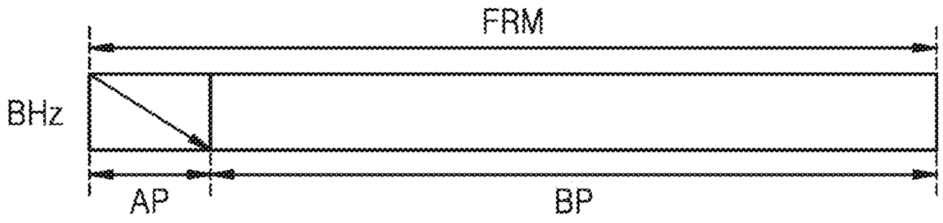

FIGS. 4A and 4B are conceptual diagrams for explaining a driving scheme of the display apparatus 10 according to an embodiment.

An image frame (hereinafter, referred to as a "frame") FRM may include an active period AP and a blank period BP. The active period AP may be a period during which at least one gate signal is supplied from a first pixel line (pixel row) to a last pixel line (pixel row) in the pixel area 11. The blank period BP may be a period after a gate signal is supplied to the last pixel line (pixel row) in the pixel area 11 and before the gate signal is supplied to a first pixel line (pixel row) of a next frame.

The display apparatus 10 may support a variable refresh rate (VRR). A refresh rate refers to a frequency at which a data signal is actually written to the driving transistor of the pixel PX. It is also known as a screen refresh rate or a screen reproduction rate, and may represent the number of frames displayed per second. For example, when the refresh rate is about 60 Hz, each pixel line (pixel row) may receive a first gate signal GW for writing a data signal from the gate driving circuit 13, and 60 frames may be displayed within one second. A frequency according to the refresh rate is referred to as a driving frequency, and the display apparatus 10 may display an image according to the driving frequency.

As shown in FIGS. 4A and 4B, when the display apparatus 10 is driven at a driving frequency of A Hz and a driving frequency of B Hz that is lower than the driving frequency of A Hz, a length of the blank period BP of the frame FRM may increase as the driving frequency decreases.

Each pixel PX may perform initialization, compensation, data writing, reset, and light emission during the active period AP for each frame. At 240 Hz, each pixel PX may be non-emissive during the blank period BP. In a mode operating at a driving frequency lower than 240 Hz, each pixel PX may maintain the light emission during the blank period BP, but no data signal is applied to the pixel PX during the blank period BP. Accordingly, when the display apparatus 10 is driven at a low frequency, the gate voltage of the first transistor T1 and the brightness of the organic light-emitting diode OLED may be changed due to the leakage current of the transistors in the pixel PX during the blank period BP, and flickering may occur when a next frame starts.

According to an embodiment, a reset operation of the active period AP is performed one or more times during the blank period BP when the display apparatus 10 is driven at a low frequency, thereby minimizing changes in the gate voltage of the first transistor T1 and the brightness of the organic light-emitting diode OLED.

Figure 5A:
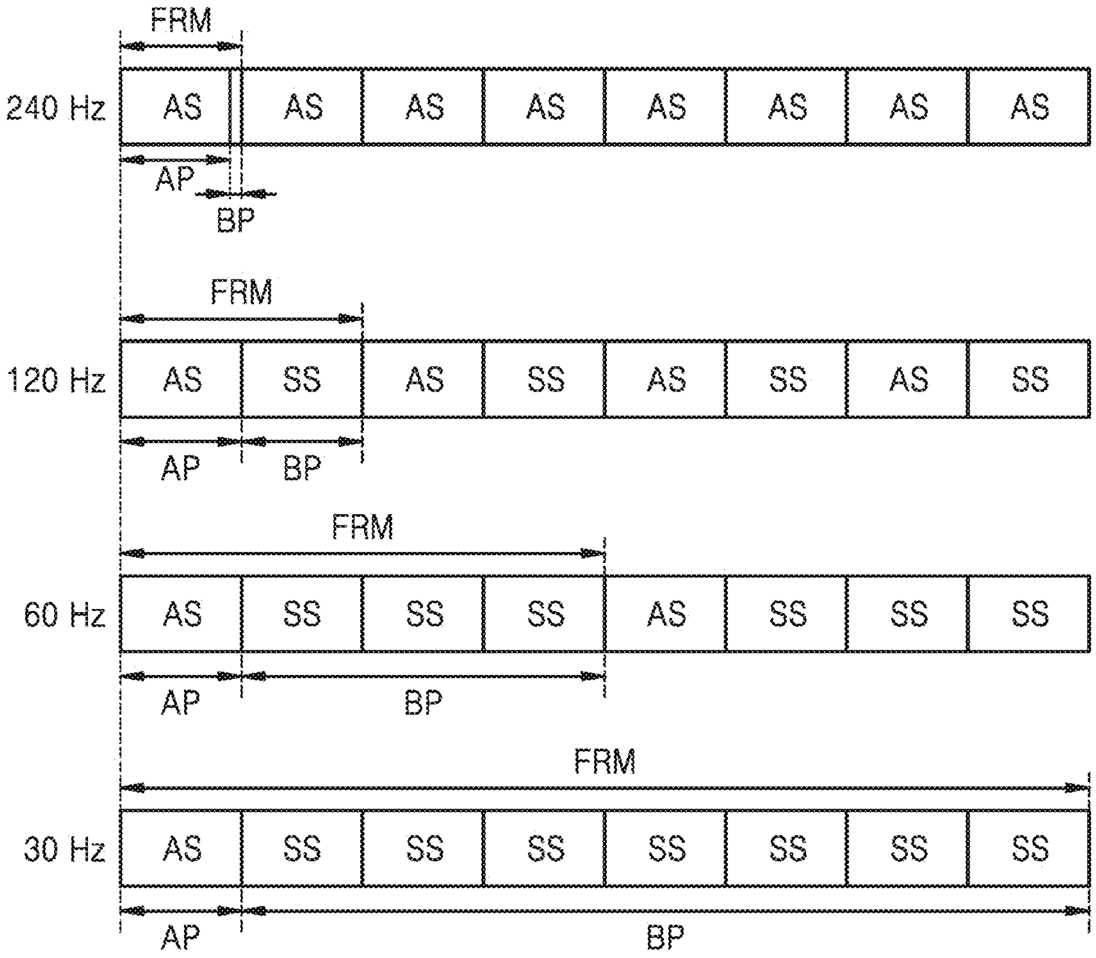
FIGS. 5A and 5B are diagrams for explaining an operation of a display apparatus according to an embodiment.
Figure 5B:
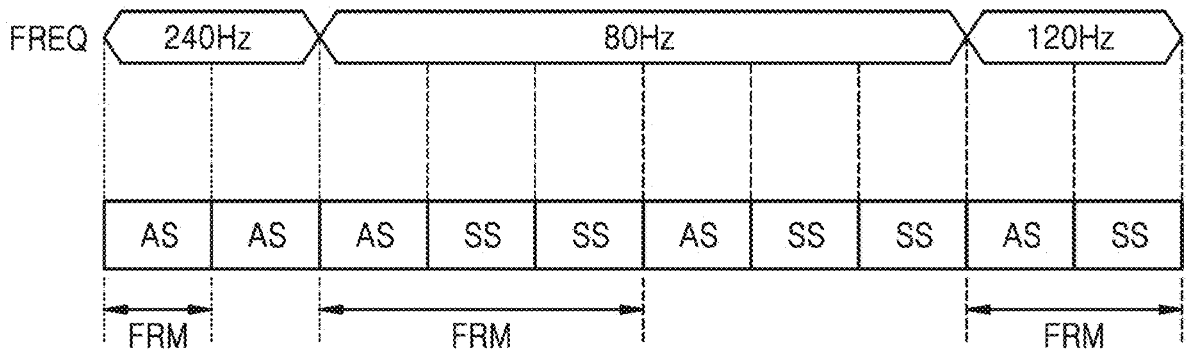
Figure 6A:
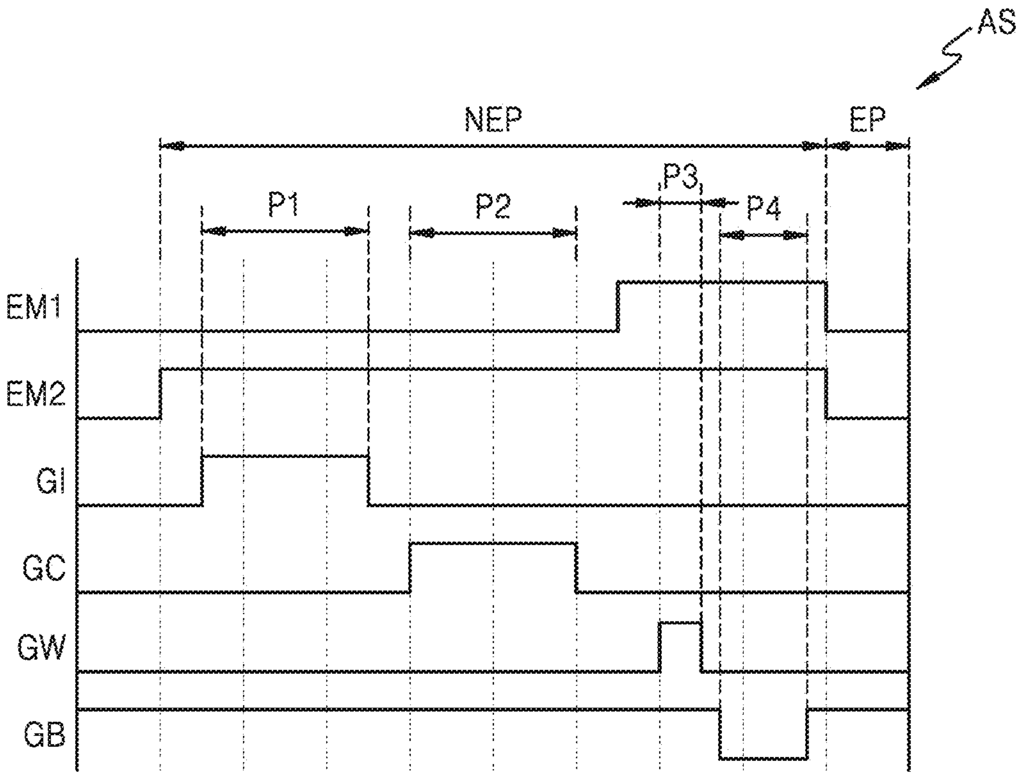
FIGS. 6A and 6B are timing diagrams for explaining an operation of a pixel according to an embodiment.
Figure 6B:
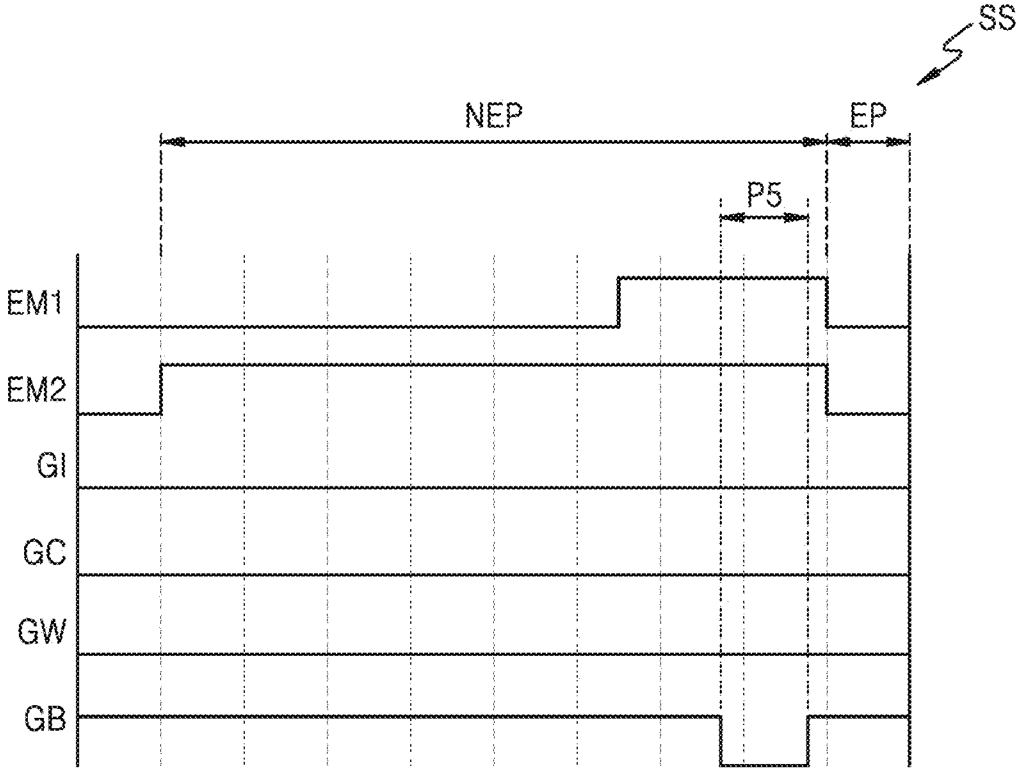
Figure 7A:
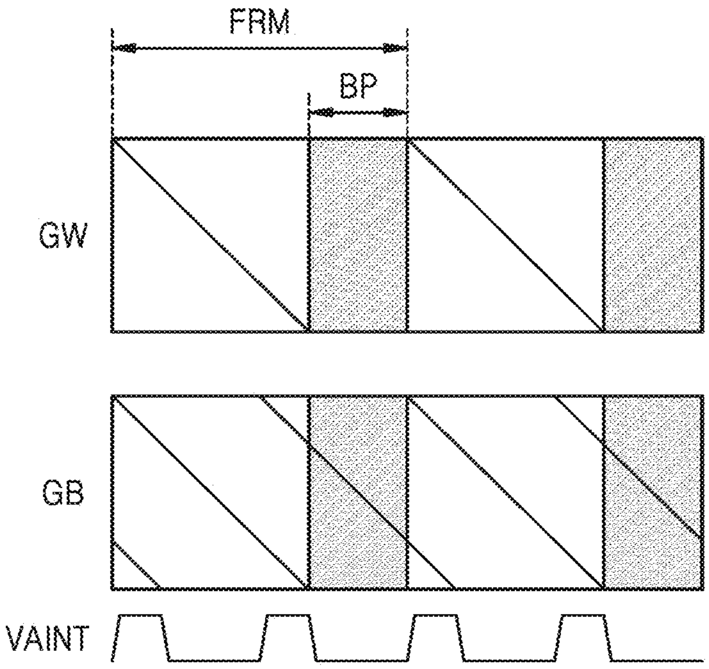
FIGS. 7A through 7C are timing diagrams for explaining mura of an image.
Figure 7B:
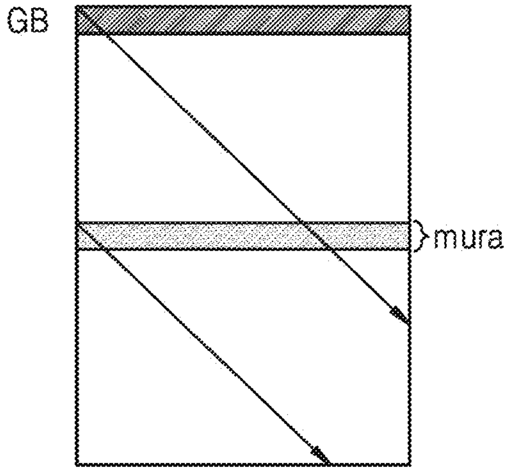
Figure 7C:
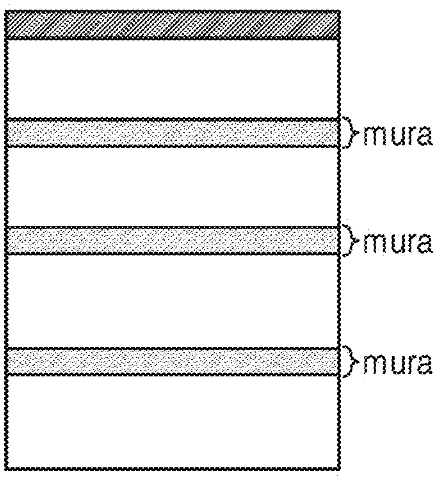
Figure 8A:
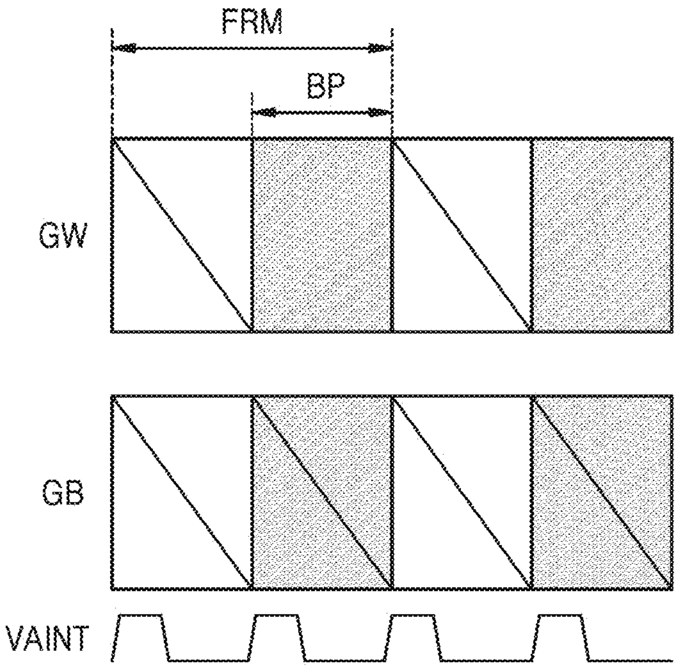
FIGS. 8A through 8C are timing diagrams for explaining a cycle of a sixth gate signal according to an embodiment.
Figure 8B:
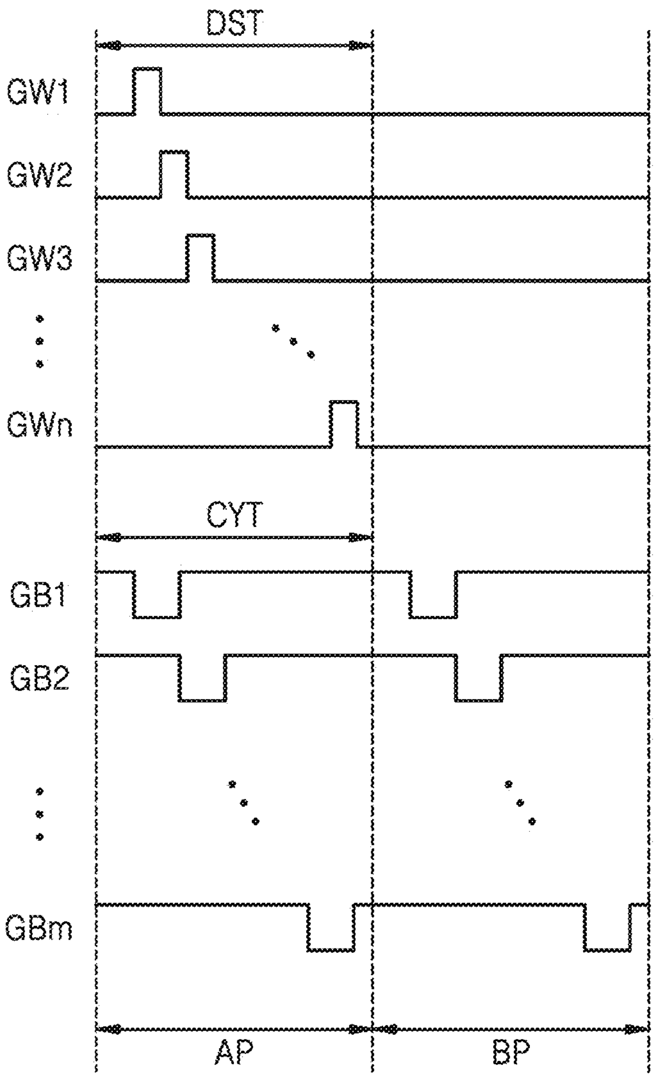
Figure 8C:
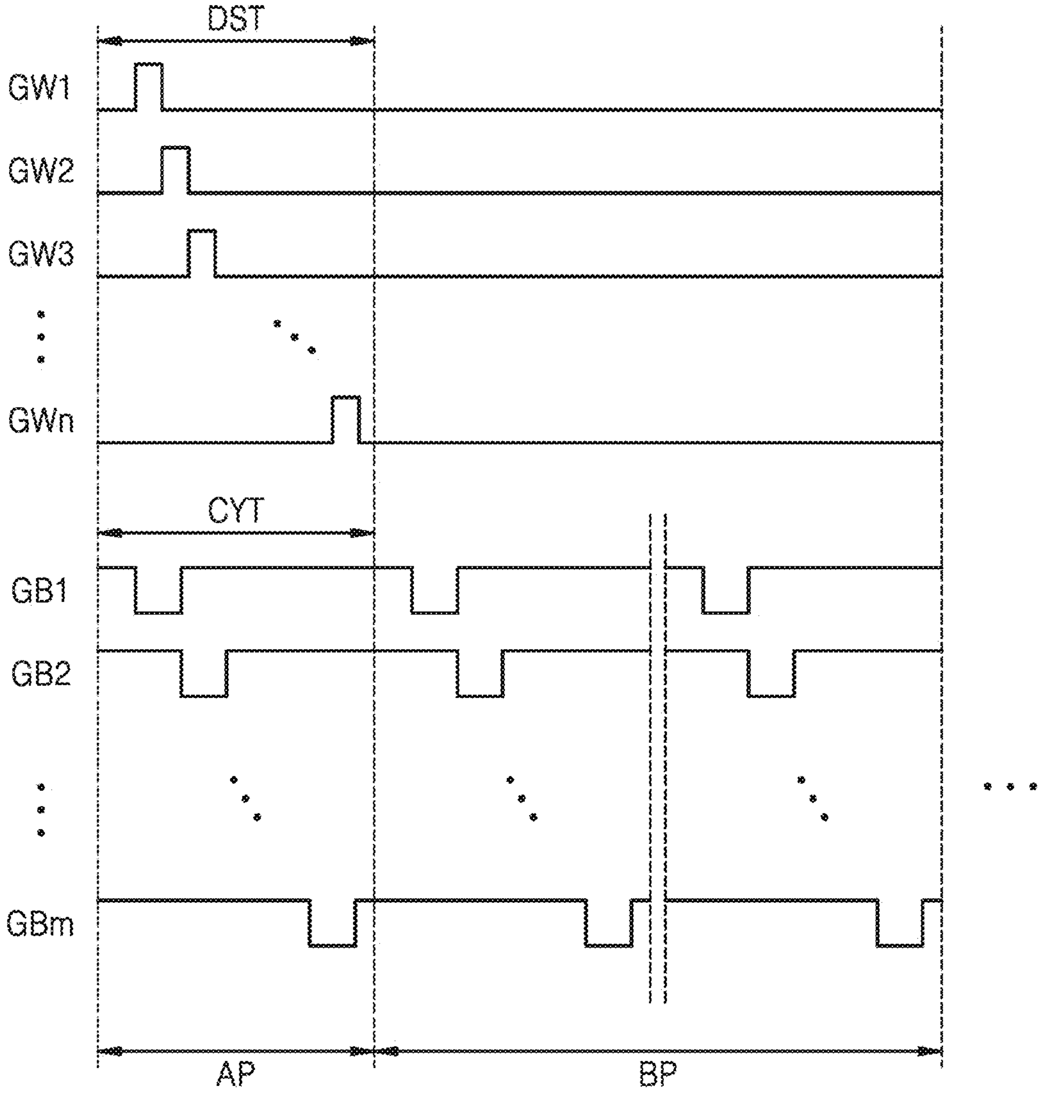

FIGS. 5A and 5B are diagrams for explaining an operation of a display apparatus according to an embodiment. FIGS. 6A and 6B are timing diagrams for explaining an operation of a pixel according to an embodiment. FIGS. 7A through 7C are timing diagrams for explaining mura of an image. FIGS. 8A through 8C are timing diagrams for explaining a cycle of a sixth gate signal according to an embodiment.

Referring to FIGS. 5A and 5B, the active period AP may include a first scan period AS. The first scan period AS may be defined as an address scan period during which a data signal is written to the pixel PX and the pixel PX emits light with a brightness corresponding to the written data signal. An operation of writing a data signal from the data line DL to the pixel PX may also be referred to as a data programming operation.

When the display apparatus 10 is driven at a low frequency, the blank period BP may include one or more second scan periods SS depending on a driving frequency. The second scan period SS may be defined as a self scan period during which no data signals are written to the pixel PX. During the second scan period SS, the data signal written to the pixel PX during the first scan period AS may be maintained, and the pixel PX may emit light with the brightness corresponding to the data signal written during the first scan period AS.

The first scan period AS may include an initialization period, a compensation period, a writing period, a reset period, and an emission period. The second scan period SS may include a reset period and an emission period.

FIG. 5A shows an example where the maximum driving frequency is 240 Hz and the driving frequency is lowered to 120 Hz, 60 Hz, 30 Hz, etc. As depicted in FIG. 5A, when the driving frequency is 120 Hz, the blank period BP of each frame FRM may include one second scan period SS. When the driving frequency is 60 Hz, the blank period BP of each frame FRM may include three second scan periods SS, and, when the driving frequency is 30 Hz, the blank period BP of each frame FRM may include seven second scan periods SS. As shown in FIG. 5B, the display apparatus 10 may change the driving frequency to 240 Hz, 80 Hz, or 120 Hz based on the refresh rate and display an image accordingly.

FIG. 6A is a timing diagram of signals supplied to the pixel PX of FIG. 4 during the first scan period AS. FIG. 6B is a timing diagram of signals supplied to the pixel PX of FIG. 4 during the second scan period SS.

The first scan period AS may include a non-emission period NEP and an emission period EP, and the non-emission period NEP may include an initialization period P1, a compensation period P2, a writing period P3, and a reset period P4. The second scan period SS may include a non-emission period NEP and an emission period EP, and the non-emission period NEP may include a reset period P5.

During the first scan period AS and the second scan period SS, the gate driving circuit 13 of FIG. 2 may supply the first, second, third, fourth, fifth, and sixth gate signals GW, GI, GC, EM1, EM2, and GB to the first, second, third, fourth, fifth, and sixth gate lines GWL GIL, GCL, EML1, EML2, and GBL, respectively.

During the first scan period AS and the second scan period SS, the power supply circuit 17 of FIG. 2 may supply the first driving voltage ELVDD to the driving voltage line VDL, supply the reference voltage VREF to the reference voltage line VRL, supply the first initializing voltage VINT to the first initializing voltage line VIL1, supply the second initializing voltage VAINT to the second initializing voltage line VIL2, supply the bias voltage VOBS to the bias voltage line VBL, and supply the second driving voltage ELVSS to the organic light-emitting diode OLED.

A period during which both the fourth gate signal EM1 and the fifth gate signal EM2 are gate-on voltages may be the emission period EP, and the remaining period may be the non-emission period NEP. Referring to FIG. 6A, the non-emission period NEP of the first scan period AS may include first, second, third, and fourth periods P1, P2, P3, and P4. Referring to FIG. 6B, the non-emission period NEP of the second scan period SS may include a fifth period P5.

The first period P1 may be an initialization period for initializing the first node N1 to which the gate of the first transistor T1 is connected. In the first period P1, a second gate signal GI of a gate-on voltage (first level voltage) may be supplied to the second gate line GIL, and a fourth gate signal EM1 of a gate-on voltage (second level voltage) may be supplied to the fourth gate line EML1. A first gate signal GW and a third gate signal GC each having a gate-off voltage (second level voltage) may be supplied to the first gate line GWL and the third gate line GCL, respectively, and a fifth gate signal EM2 and a sixth gate signal GB each having a gate-off voltage (first level voltage) may be supplied to the fifth gate line EML2 and the sixth gate line GBL, respectively.

The fourth transistor T4 may be turned on by the second gate signal GI, and the gate of the first transistor T1 may be initialized with the first initializing voltage VINT. The sixth transistor T6 may be turned on by the fourth gate signal EM1, and the first driving voltage ELVDD may be supplied to the first terminal of the first transistor T1.

The second period P2 may be a compensation period for compensating for a threshold voltage of the first transistor T1. In the second period P2, a third gate signal GC of a gate-on voltage (first level voltage) may be supplied to the third gate line GCL, and a fourth gate signal EM1 of a gate-on voltage (second level voltage) may be supplied to the fourth gate line EML1. A first gate signal GW and a second gate signal GI each having a gate-off voltage (second level voltage) may be supplied to the first gate line GWL and the second gate line GIL, respectively, and a fifth gate signal EM2 and a sixth gate signal GB each having a gate-off voltage (first level voltage) may be supplied to the fifth gate line EML2 and the sixth gate line GBL, respectively.

The third transistor T3 and the fifth transistor T5 may be turned on by the third gate signal GC. The reference voltage VREF may be supplied to the fourth node N4 by the turned-on fifth transistor T5. A difference ELVDD-Vth between the first driving voltage ELVDD and the threshold voltage Vth of the first transistor T1 may be supplied to the gate of the first transistor T1 which is diode-connected by the turned-on third transistor T3. The second capacitor C2 may be charged with a voltage corresponding to the threshold voltage Vth of the first transistor T1.

The third period P3 may be a writing period (data programming period) during which a data signal is applied to the pixel PX. In the third period P3, a voltage corresponding to the data signal may be stored in the gate of a driving transistor (first transistor).

In the third period P3, the first gate signal GW of a gate-on voltage (first level voltage) may be supplied to the first gate line GWL. A second gate signal GI and a third gate signal GC each having a gate-off voltage (second level voltage) may be supplied to the second gate line GIL and the third gate line GCL, respectively, and a fourth gate signal EM1, a fifth gate signal EM2, and a sixth gate signal GB each having a gate-off voltage (first level voltage) may be supplied to the fourth gate line EML1, the fifth gate line EML2, and the sixth gate line GBL, respectively.

The second transistor T2 may be turned on by the first gate signal GW. The turned-on second transistor T2 may transmit the data signal Vdata received from the data line DL to the fourth node N4. Accordingly, the voltage of the fourth node N4 may change by a voltage corresponding to a difference between the reference voltage VREF and the data signal Vdata. In response to the voltage change at the fourth node N4, the voltage at the first node N1 may also be adjusted. Thus, the second capacitor C2 may be charged with a voltage corresponding to the threshold voltage Vth of the first transistor T1 and the data signal Vdata.

The fourth period P4 and the fifth period P5 may be reset periods for resetting the pixel electrode of the organic light-emitting diode OLED. In the fourth period P4 and the fifth period P5, the sixth gate signal GB of a gate-on voltage (second level voltage) may be supplied to the sixth gate line GBL. A first gate signal GW, a second gate signal GI, and a third gate signal GC each having a gate-off voltage (second level voltage) may be supplied to the first gate line GWL, the second gate line GIL, and the third gate line GCL, respectively. In addition, a fourth gate signal EM1 and a fifth gate signal EM2 each having a gate-off voltage (first level voltage) may be supplied to the fourth gate line EML1 and the fifth gate line EML2, respectively.

The eighth transistor T8 may be turned on by the sixth gate signal GB. The turned-on eighth transistor T8 may transmit the second initialization voltage VAINT supplied from the second initialization voltage line VIL2 to the pixel electrode of the organic light-emitting diode OLED.

The ninth transistor T9 may be turned on by the sixth gate signal GB. The turned-on ninth transistor T9 may transmit the bias voltage VOBS supplied from the bias voltage line VBL to the second node N2, thereby controlling the gate-source voltage of the first transistor T1 and compensating for any changes in the current characteristics of the first transistor T1. In other words, the fourth period P4 and the fifth period P5 may be bias periods for compensating for voltage-current characteristics of the first transistor T1.

As the pixel electrode of the organic light-emitting diode OLED is initialized in the fifth period P5 and the voltage-current characteristics of the first transistor T1 is compensated for, the pixel PX may maintain the brightness of an image output during the first scan period AS even in the second scan period SS. Accordingly, image flickering may be minimized.

The organic light-emitting diode OLED may emit light during the emission period EP. During the emission period EP, the fourth gate signal EM1 and the fifth gate signal EM2 each having a gate-on voltage (second level voltage) may be supplied to the fourth gate line EML1 and the fifth gate line EML2, respectively. A first gate signal GW, a second gate signal GI, and a third gate signal GC each having a gate-off voltage (second level voltage) may be supplied to the first gate line GWL, the second gate line GIL, and the third gate line GCL, respectively. And a sixth gate signal GB of a gate-off voltage (first level voltage) may be supplied to the sixth gate line GBL.

The sixth transistor T6 and the seventh transistor T7 may be turned on according to the fourth gate signal EM1 and the fifth gate signal EM2. A current path from the driving voltage line VDL to the organic light-emitting diode OLED may be formed by the turned-on sixth transistor T6 and the turned-on seventh transistor T7. The first transistor T1 may output a driving current corresponding to the data signal, and the organic light-emitting diode OLED may emit light with a brightness corresponding to the driving current.

Hereinafter, when a signal is said to be supplied, it means that the gate-on voltage of the signal is supplied, and when a signal is said to be not supplied, it means that the gate-off voltage of the signal is supplied.

The blank period BP, when the display apparatus 10 is driven at a low frequency, may include one or more second scan periods SS, and the pixel PX may perform two or more reset operations during one frame FRM. As illustrated in FIG. 7A, the sixth gate signal GB may be supplied two or more times to achieve two or more reset operations during one frame FRM.

FIG. 7B illustrates a copy mura phenomenon when the sixth gate signal GB is supplied twice during one frame, and FIG. 7C illustrates a copy mura phenomenon when the sixth gate signal GB is supplied four times during one frame.

If the sixth gate signal GB is supplied while the first gate signal GW for writing the data signal is being supplied, a copy mura phenomenon may occur in which an image similar to an image on an upper end of a screen is displayed on the screen, as shown in FIGS. 7B and 7C. An area where the pixel electrode of the organic light-emitting diode OLED supplied with the sixth gate signal GB overlaps with the data line DL supplying the data signal may be susceptible to the copy mura phenomenon.

In an embodiment, occurrence of the copy mura phenomenon during low-frequency driving may be minimized by controlling a period (cycle) of the sixth gate signal GB and a scan time of the first gate signal GW within one frame. The scan time may be a time taken for a gate signal to be supplied to all pixels in a pixel area. In detail, the scan time may be a time taken for a gate signal to be supplied from a first pixel line (pixel row) to a last pixel line (pixel row). The scan time of the first gate signal GW may be a time taken for the first gate signal GW to be supplied from the first pixel line (pixel row) to the last pixel line (pixel row). The scan time of the first gate signal GW may be substantially equal to a length of the first scan period AS.

According to an embodiment, the scan time of the first gate signal GW may be less than or equal to a cycle time of the sixth gate signal GB. The cycle time may be the period of a signal. The cycle time of the sixth gate signal GB may be a period during which the sixth gate signal GB is supplied to the eighth transistor T8 of the pixel PX. The cycle time of the sixth gate signal GB may be a period during which the second initialization voltage VAINT is supplied to the pixel electrode of the pixel PX.

Referring FIG. 6A and FIG. 6B, the first gate signal GW, the second gate signal GI, and the third gate signal GC may be supplied to each pixel PX during the first scan period AS, while the fourth gate signal EM1, the fifth gate signal EM2, and the sixth gate signal GB may be supplied during not only the first scan period AS but also the second scan period SS.

Accordingly, as depicted in FIG. 5A, during driving at 120 Hz, within one frame FRM, the first gate signal GW, the second gate signal GI, and the third gate signal GC may be supplied to each pixel PX in one cycle, and the fourth gate signal EM1, the fifth gate signal EM2, and the sixth gate signal GB may be supplied in two cycles. During driving at 60 Hz, within one frame FRM, the first gate signal GW, the second gate signal GI, and the third gate signal GC may be supplied to each pixel PX in one cycle, and the fourth gate signal EM1, the fifth gate signal EM2, and the sixth gate signal GB may be supplied in four cycles. During driving at 30 Hz, within one frame FRM, the first gate signal GW, the second gate signal GI, and the third gate signal GC may be supplied to each pixel PX in one cycle, and the fourth gate signal EM1, the fifth gate signal EM2, and the sixth gate signal GB may be supplied in eight cycles.

FIGS. 8A and 8B show the blank period BP of one frame FRM and the cycles of the first gate signal GW and the sixth gate signal GB during driving 120 Hz operation. When driving at 120 Hz, a scan time DST of the first gate signal GW, a length of the blank period BP, and a cycle time CYT of the sixth gate signal GB may be the same as each other. For example, in FIG. 5A, when the scan time of the first gate signal GW is 4.15 ms when driven at 240 Hz, the scan time DST of the first gate signal GW may be 4.15 ms when driven at 120 Hz, and the length of the blank period BP and the cycle time CYT of the sixth gate signal GB may each be 4.15 ms.

As illustrated in FIG. 8C, when driven at a low frequency, the scan time DST of the first gate signal GW and the cycle time CYT of the sixth gate signal GB may be the same as each other. As a result, the copy mura phenomenon may not be recognized in an area where the pixel electrode and the data line DL overlap each other, even if the sixth gate signal GB is supplied while the first gate signal GW is being supplied.

Figure 9:
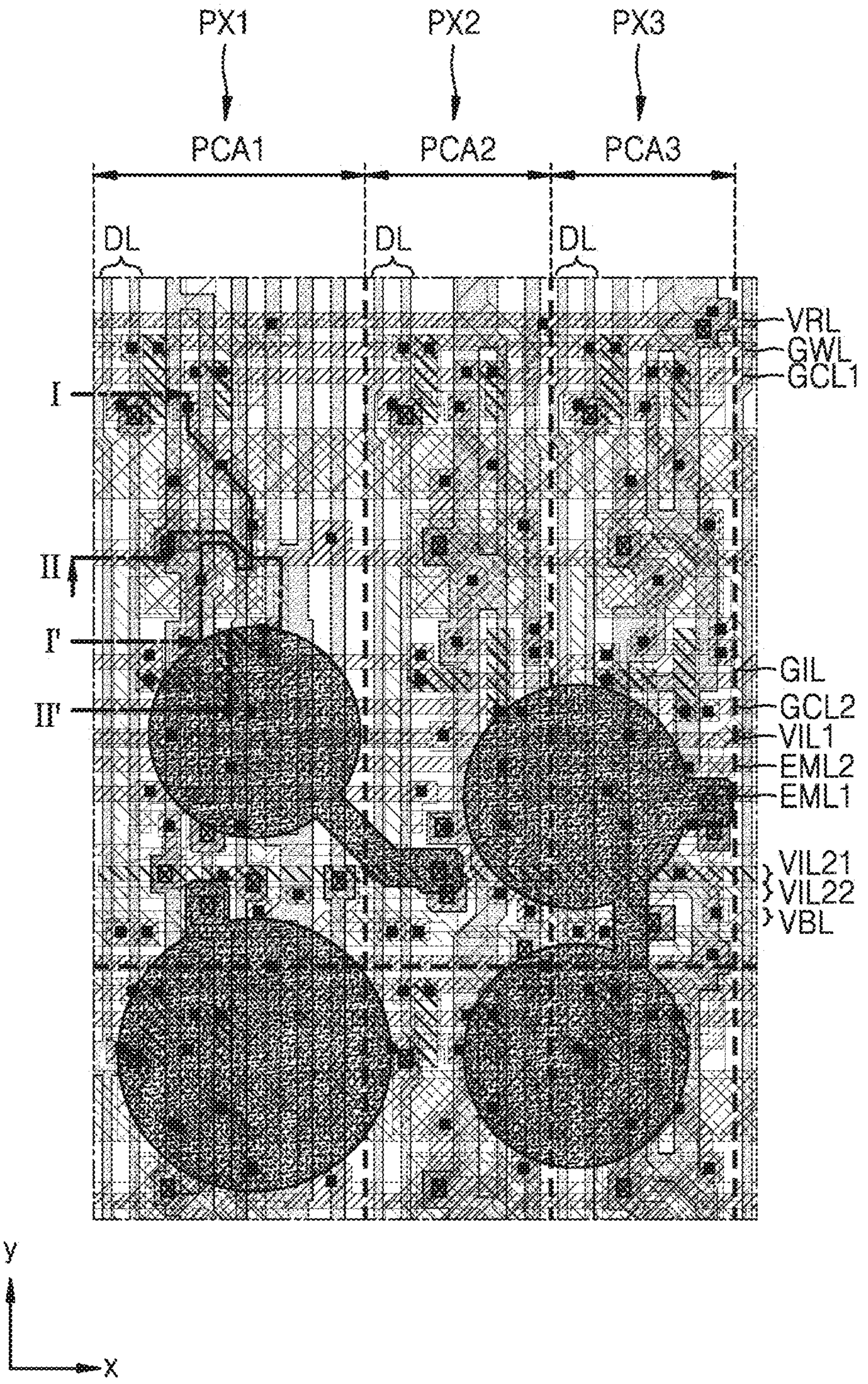
FIG. 9 is a schematic layout view illustrating the pixel shown in FIG. 3.
Figure 18:
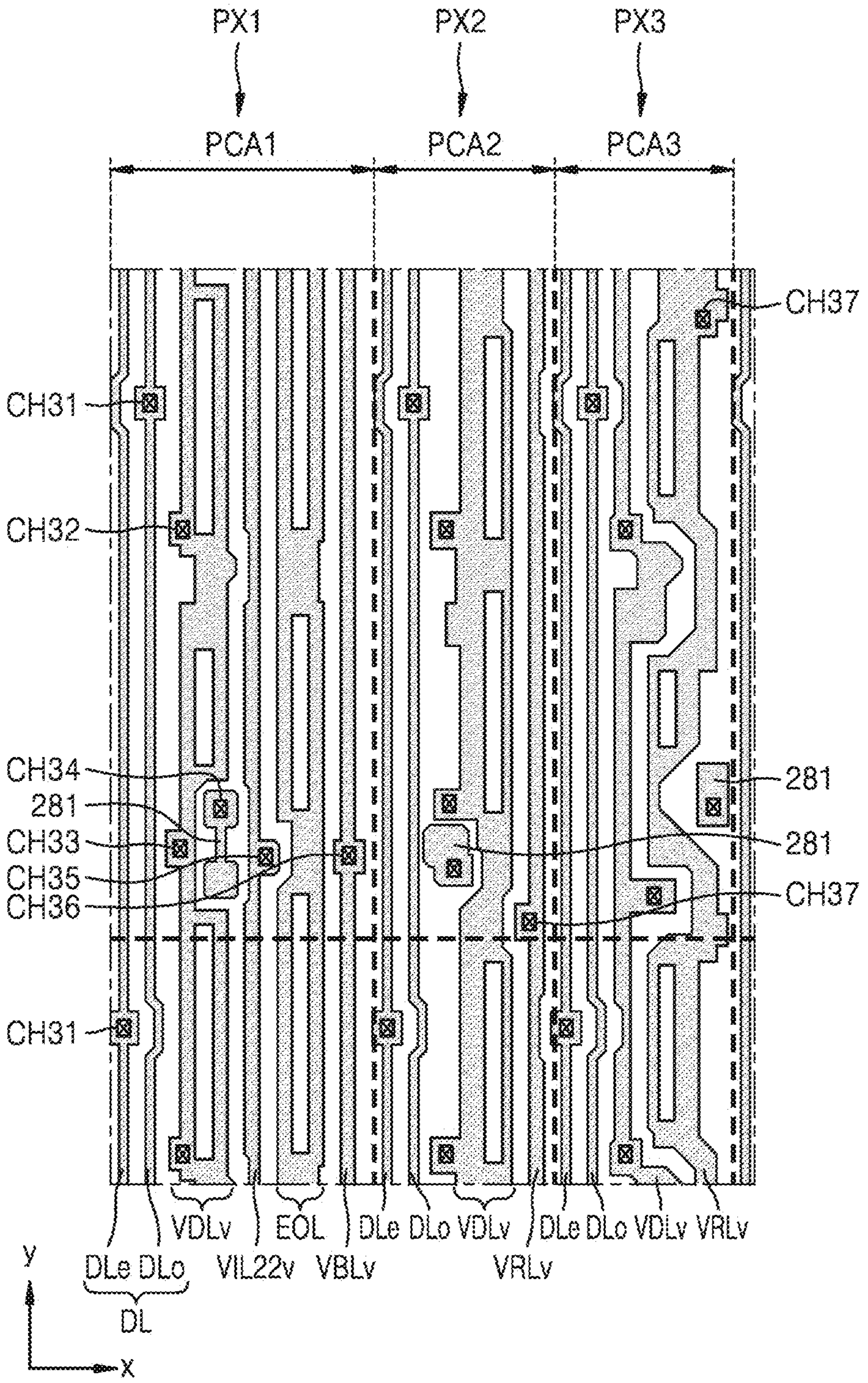
Figure 19:
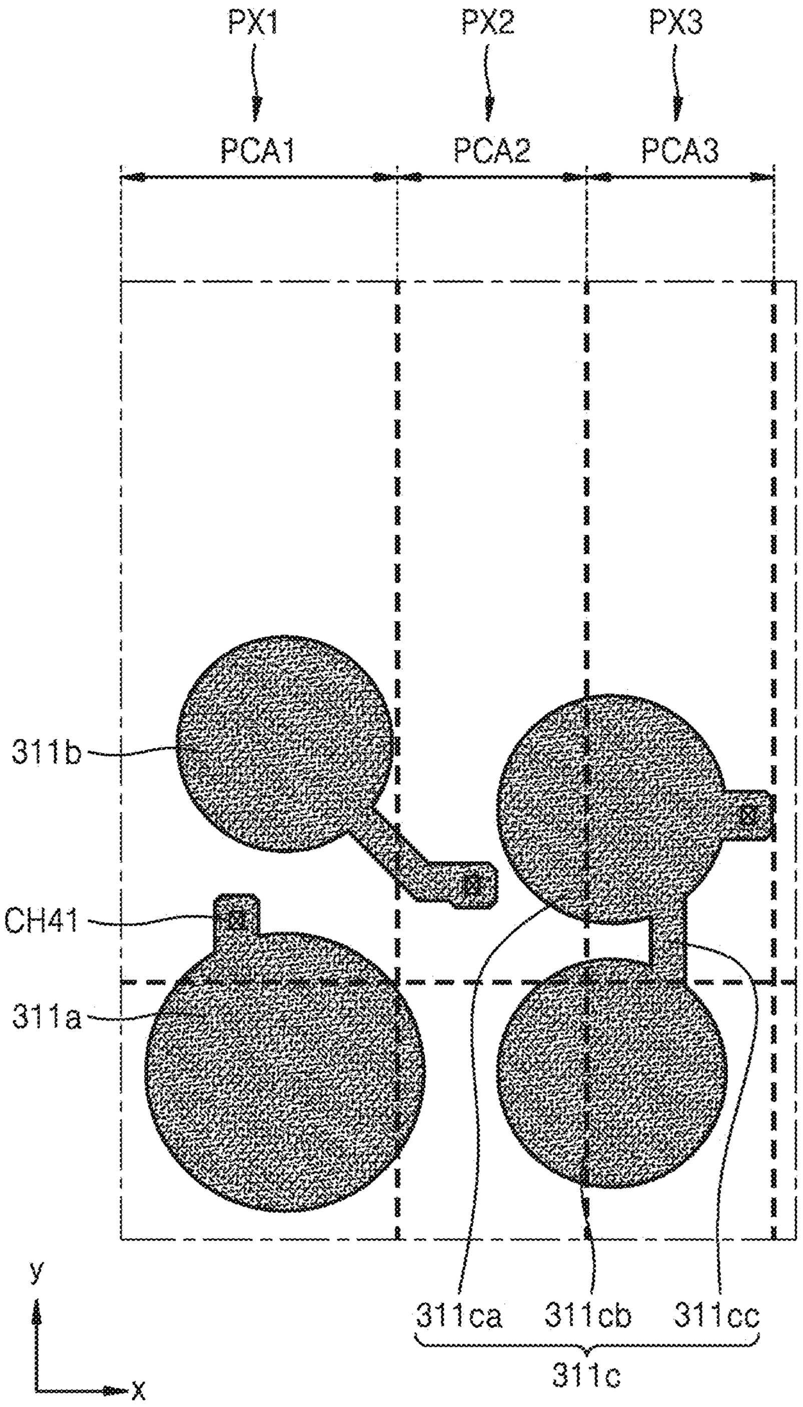
Figure 20:
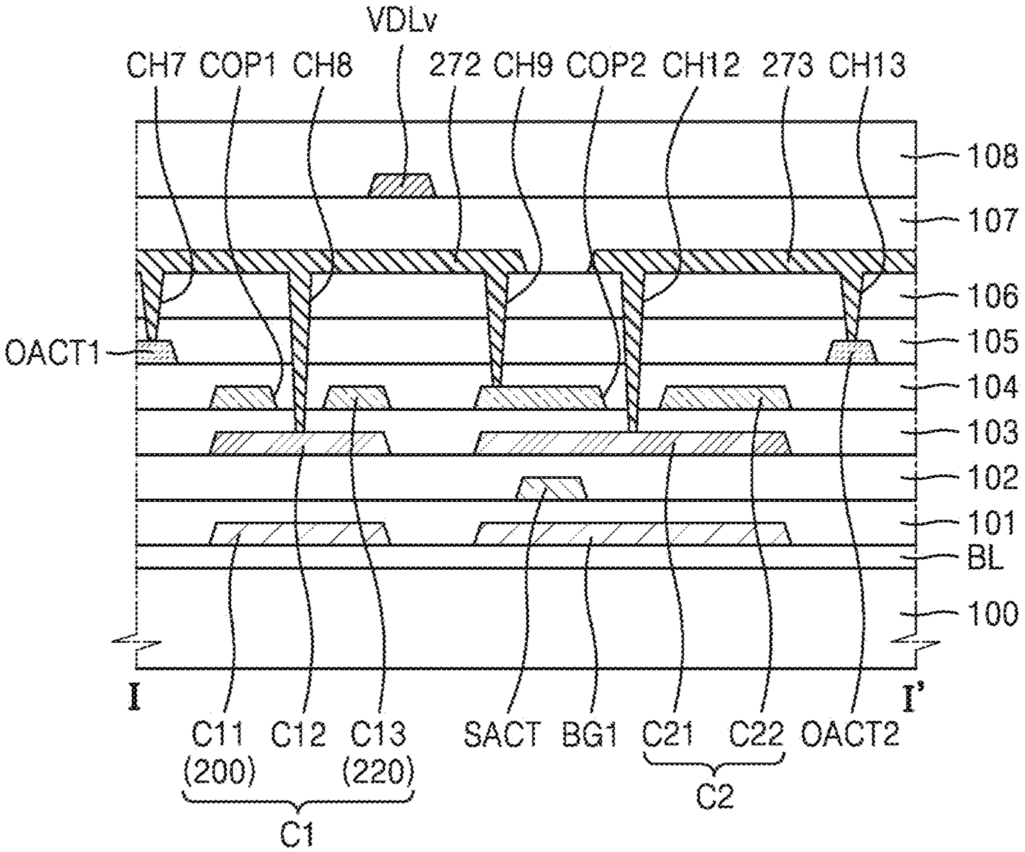
FIG. 20 is a cross-sectional view of the pixel of FIG. 9 taken along a line I-I'.
Figure 21:
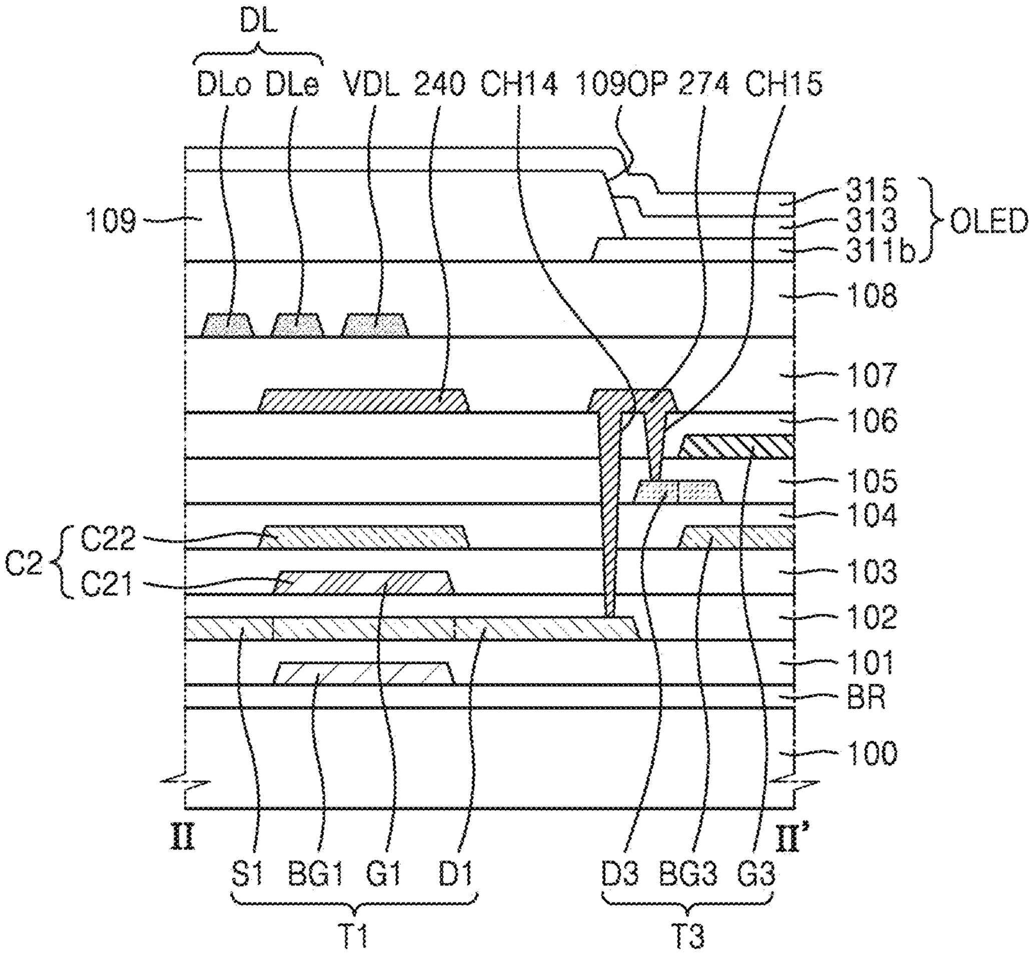
FIG. 21 is a cross-sectional view of the pixel of FIG. 9 taken along a line II-II'.

FIG. 9 is a schematic layout view illustrating the pixel PX shown in FIG. 3. FIGS. 10 through 19 are schematic layout views illustrating an arrangement of the components of the pixel PX of FIG. 3 on a layer-by-layer basis. FIG. 20 is a cross-sectional view of the pixel of FIG. 9 taken along a line I-I'. FIG. 21 is a cross-sectional view of the pixel of FIG. 9 taken along a line II-II'.

Pixels PX arranged in the display area DA may include a first pixel PX1 emitting light in a first color, a second pixel PX2 emitting light in a second color, and a third pixel PX3 emitting light in a third color. For example, the first pixel PX1 may be a green pixel, the second pixel PX2 may be a red pixel, and the third pixel PX3 may be a blue pixel. The first pixel PX1, the second pixel PX2, and the third pixel PX3 may be arranged in a repeating pattern in the x direction and the y direction. Each of the first pixel PX1, the second pixel PX2, and the third pixel PX3 may include a pixel circuit and an organic light-emitting diode OLED, as a display element, electrically connected to the pixel circuit.

The display area DA of a substrate 100 of FIG. 20 may include a plurality of circuit areas. The circuit area may be an area where rows (pixel rows) and columns (pixel columns) intersect each other and may be an area where a pixel circuit is arranged. According to an embodiment, a unit circuit area including two or more circuit areas adjacent to each other in an x direction may be defined, and a unit pixel may be defined by pixels arranged in circuit areas that make up the unit circuit area in the display area DA of the substrate 100. For example, the unit circuit area may include three circuit areas, namely, a first circuit area PCA1, a second circuit area PCA2, and a third circuit area PCA3 adjacent to each other in the x direction, and a unit pixel may include a first pixel PX1, a second pixel PX2, and a third pixel PX3. The first pixel area PCA1 may be an area where the pixel circuit of the first pixel PX1 is disposed. The second pixel area PCA2 may be an area where the pixel circuit of the second pixel PX2 is disposed. The third pixel area PCA3 may be an area where the pixel circuit of the third pixel PX3 is disposed. According to an embodiment, the area of the first circuit area PCA1 may be greater than the area of each of the second circuit area PCA2 and the third circuit area PCA3.

Each of the pixel circuits arranged in the first circuit area PCA1, the second circuit area PCA2, and the third circuit area PCA3 in FIG. 9 may correspond to the pixel circuit PC of the pixel PX illustrated in FIG. 3.

According to an embodiment, different second initializing voltages VAINT may be supplied to the first pixel PX1, the second pixel PX2, and the third pixel PX3 in consideration of emission characteristics of the first pixel PX1, the second pixel PX2, and the third pixel PX3. For example, the pixel circuit PC of the second pixel PX2 may be connected to a $2^{nd}$-1 initializing voltage line VIL21, and the pixel circuit PC of the first pixel PX1 and the pixel circuit PC of the third pixel PX3 may be connected to a $2^{nd}$-2 initializing voltage line VIL22. A second initializing voltage supplied to the $2^{nd}$-1 initializing voltage line VIL21 may be different from a second initializing voltage supplied to the $2^{nd}$-2 initializing voltage line VIL22.

Elements having the same functions may be arranged on respective layers of the first pixel area PCA1, the second pixel area PCA2, and the third pixel area PCA3. Hereinafter, for convenience of illustration and description, identification numerals are assigned to the elements of a pixel circuit PC disposed in the first pixel area PCA1, and the first pixel area PCA1 will be mainly described. Descriptions of the elements of the first pixel area PCA1 are similarly applied to the same elements of the second pixel area PCA2 and the third pixel area PCA3. The pixel will now be described with reference to FIGS. 10 through 21. A connection electrode may be an electrode that electrically connects conductive lines and electrodes (conductive patterns) arranged in different layers to transmit a signal.

Figure 10:
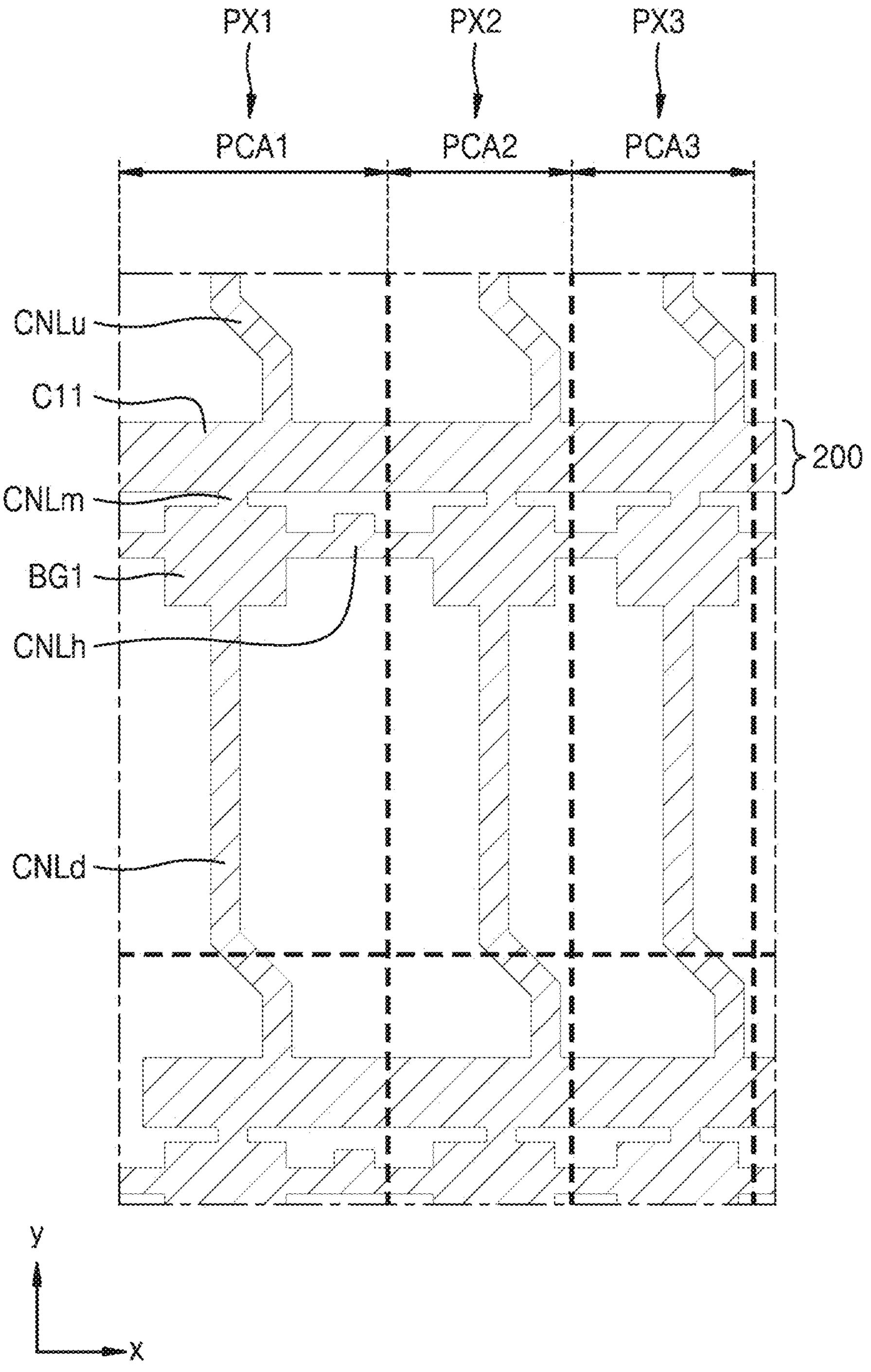
FIGS. 10 through 19 are schematic layout views illustrating an arrangement of components of the pixel of FIG. 3 on a layer-by-layer basis.

A first conductive layer may be disposed on the substrate 100. As shown in FIG. 10, the first conductive layer may include a conductive line 200 and a first back gate electrode BG1. According to an embodiment, a barrier layer BL may be further disposed between the substrate 100 and the first conductive layer.

The conductive line 200 may extend in the x direction and may be arranged over the first pixel areas PCA1, the second pixel area PCA2, and the third pixel area PCA3. The conductive line 200 may receive the first power supply voltage ELVDD. The conductive line 200 may be a portion of the driving voltage line VDL. The conductive line 200 may include a first capacitor electrode C11 of the first capacitor C1 in each circuit area. First capacitor electrodes C11 of pixels adjacent to each other in the x direction may be connected to each other.

The first back gate electrode BG1 may be disposed in each of the first pixel areas PCA1, the second pixel area PCA2, and the third pixel area PCA3. The first back gate electrode BG1 may be a lower gate electrode of the first transistor T1. First back gate electrodes BG1 of pixels adjacent to each other in the x direction may be connected to each other by a connection part CNLh. According to an embodiment, a length of a connection part CNLh connecting the first back gate electrodes BG1 of the first pixel PX1 and the second pixel PX2 to each other may be greater than a length of a connection part CNLh connecting the first back gate electrodes BG1 of the second pixel PX2 and the third pixel PX3 to each other.

The conductive line 200 and the first back gate electrode BG1 may be connected to each other by a connection part CNLm, and the first back gate electrode BG1 may be supplied with the first driving voltage ELVDD. The conductive lines 200 and the first back gate electrode BG1 of pixels adjacent to each other in the y direction may be connected to each other by connection parts CNLu and CNLd each extending in the y direction.

The conductive line 200, the first back gate electrode BG1, and the connection parts CNLh, CNLm, CNLu, and CNLd may be formed integrally.

Figure 11:
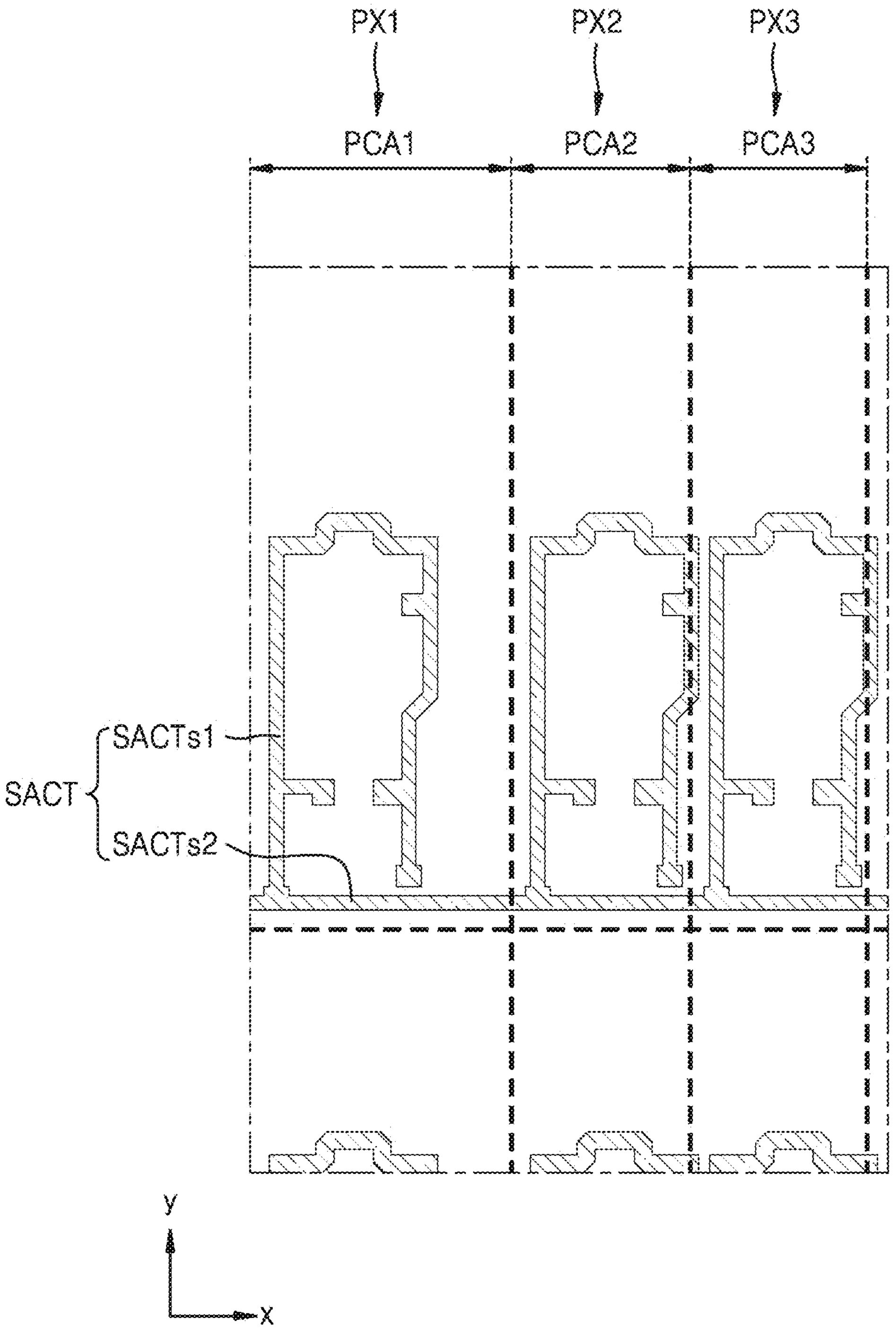

A first insulating layer 101 may be disposed on the substrate 100 while covering the first conductive layer. As shown in FIG. 11, a first semiconductor layer SACT including a silicon semiconductor may be disposed on the first insulating layer 101. The first semiconductor layer SACT may include a first portion SACTs1 that extends with a curvature along an edge of the pixel area and a second portion SACTs2 that extends in the x direction. Second portions SACTs2 of the pixel areas may be connected to each other. The first semiconductor layers SACT of the pixel areas may be formed integrally.

The first semiconductor layer SACT may include a source region, a drain region, and a channel region between the source region and the drain region of each of the first transistor T1 and the sixth through ninth transistors T6 through T9. In some cases, a source region or a drain region may be understood as a source electrode or drain electrode of a transistor.

Figure 16:
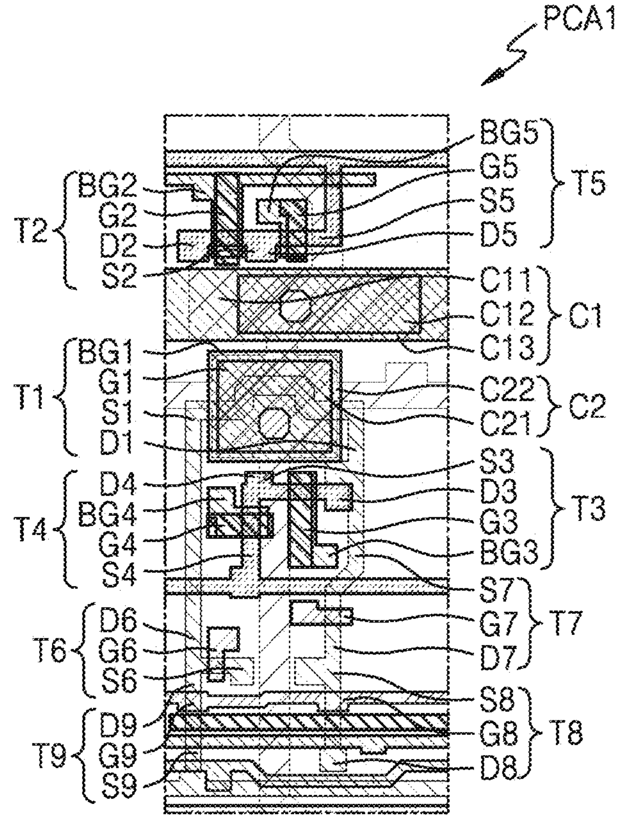

Referring to FIG. 16, the first semiconductor layer SACT may include a source region S1 and a drain region D1 of the first transistor T1, a source region S6 and a drain region D6 of the sixth transistor T6, a source region S7 and a drain region D7 of the seventh transistor T7, a source region S8 and a drain region D8 of the eighth transistor T8, and a source region S9 and a drain region D9 of the ninth transistor T9.

Figure 12:
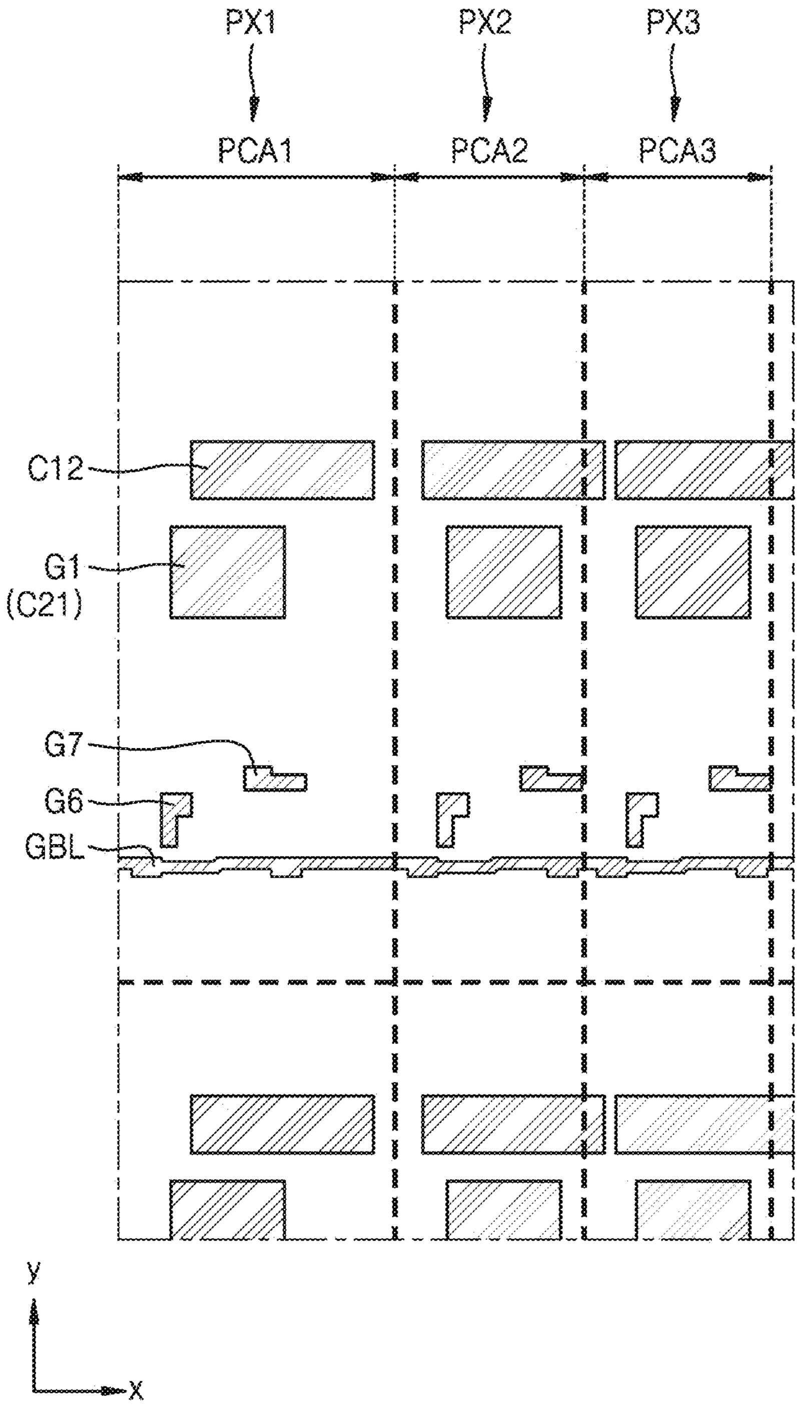

A second insulating layer 102 may be disposed on the first insulating layer 101 while covering the first semiconductor layer SACT, and a second conductive layer may be disposed on the second insulating layer 102. As illustrated in FIG. 12, the second conductive layer may include a first gate electrode G1, a sixth gate electrode G6, a seventh gate electrode G7, a sixth gate line GBL, and a second capacitor electrode C12 of the first capacitor C1.

The first gate electrode G1, the sixth gate electrode G6, the seventh gate electrode G7, and the second capacitor electrode C12 of the first capacitor C1 may each be provided in an island type for each pixel area.

The sixth gate line GBL may extend in the x direction and may be arranged over the first pixel areas PCA1, the second pixel area PCA2, and the third pixel area PCA3.

Referring to FIG. 16, the first gate electrode G1 may be an upper gate electrode of the first transistor T1. The first gate electrode G1 may overlap the first back gate electrode BG1 and the first semiconductor layer SACT. A region of the first semiconductor layer SACT that overlaps the first gate electrode G1 may be the channel region of the first transistor T1. The first gate electrode G1 may include a first capacitor electrode C21 of the second capacitor C2.

The sixth gate electrode G6 may be a gate electrode of the sixth transistor T6. The sixth gate electrode G6 may overlap the first semiconductor layer SACT. A region of the first semiconductor layer SACT that overlaps the sixth gate electrode G6 may be the channel region of the sixth transistor T6.

The seventh gate electrode G7 may be a gate electrode of the seventh transistor T7. The seventh gate electrode G7 may overlap the first semiconductor layer SACT. A region of the first semiconductor layer SACT that overlaps the seventh gate electrode G7 may be the channel region of the seventh transistor T7.

A gate electrode G8 of the eighth transistor T8 may be a portion of the sixth gate line GBL overlapping the first semiconductor layer SACT. A region of the first semiconductor layer SACT that overlaps the eighth gate electrode G8 may be the channel region of the eighth transistor T8.

A gate electrode G9 of the ninth transistor T9 may be a portion of the sixth gate line GBL overlapping the first semiconductor layer SACT. A region of the first semiconductor layer SACT that overlaps the ninth gate electrode G9 may be the channel region of the ninth transistor T9.

The second electrode C12 of the first capacitor C1 may overlap the first capacitor electrode C11.

Figure 13:
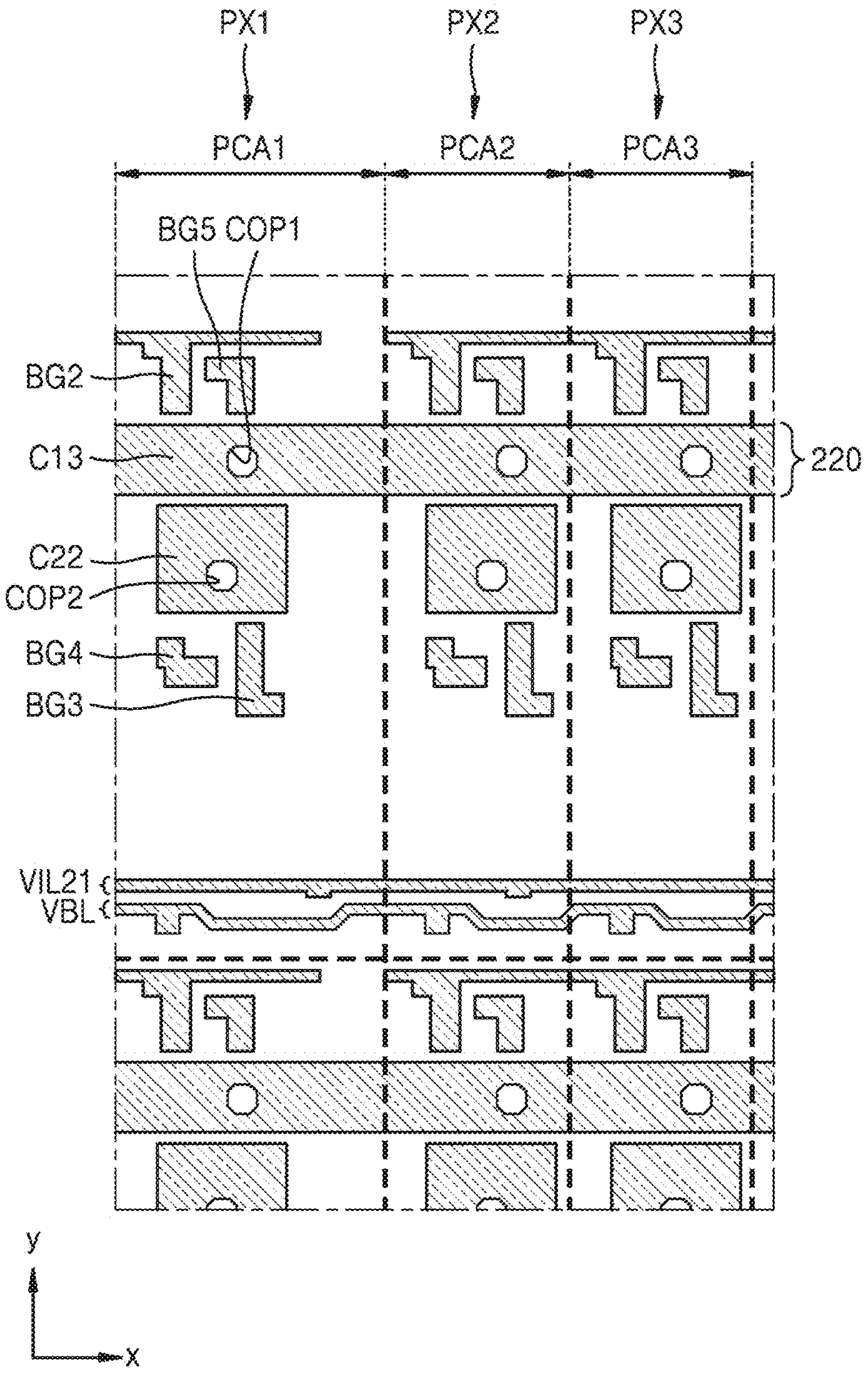

A third insulating layer 103 may be disposed on the second insulating layer 102 while covering the second conductive layer, and a third conductive layer may be disposed on the third insulating layer 103. As illustrated in FIG. 13, the third conductive layer may include a conductive line 220, a second back gate electrode BG2, a third back gate electrode BG3, a fourth back gate electrode BG4, a fifth back gate electrode BG5, a second capacitor electrode C22 of the second capacitor C2, a $2^{nd}$-1 initializing voltage line VIL21, and a bias voltage line VBL The conductive line 220 may extend in the x direction and may be arranged over the first pixel areas PCA1, the second pixel area PCA2, and the third pixel area PCA3. The conductive line 220 may overlap the conductive line 200 and the second capacitor electrode C12 of the first capacitor C1. The conductive line 220 may include a third capacitor electrode C13 of the first capacitor C1 in each circuit area. Third capacitor electrodes C13 of respective first capacitors C1 of pixels adjacent to each other in the x direction may be connected to each other. The third capacitor electrode C13 of the first capacitor C1 may include an opening COP1 overlapping the second capacitor electrode C12.

The second back gate electrode BG2, the third back gate electrode BG3, the fourth back gate electrode BG4, the fifth back gate electrode BG5, and the second capacitor electrode C22 of the second capacitor C2 may each be provided in an island type for each pixel area.

The second back gate electrode BG2 may be a lower gate electrode of the second transistor T2. The third back gate electrode BG3 may be a lower gate electrode of the third transistor T3. The fourth back gate electrode BG4 may be a lower gate electrode of the fourth transistor T4. The fifth back gate electrode BG5 may be a lower gate electrode of the fifth transistor T5.

The second electrode C22 of the second capacitor C2 may overlap the first gate electrode G1 and the first back gate electrode BG1. The second capacitor electrode C22 of the second capacitor C2 may include an opening COP2 overlapping the first gate electrode G1.

The $2^{nd}$-1 initializing voltage line VIL21 and the bias voltage line VBL may each extend in the x direction and may be arranged over the first pixel areas PCA1, the second pixel area PCA2, and the third pixel area PCA3.

Figure 14:
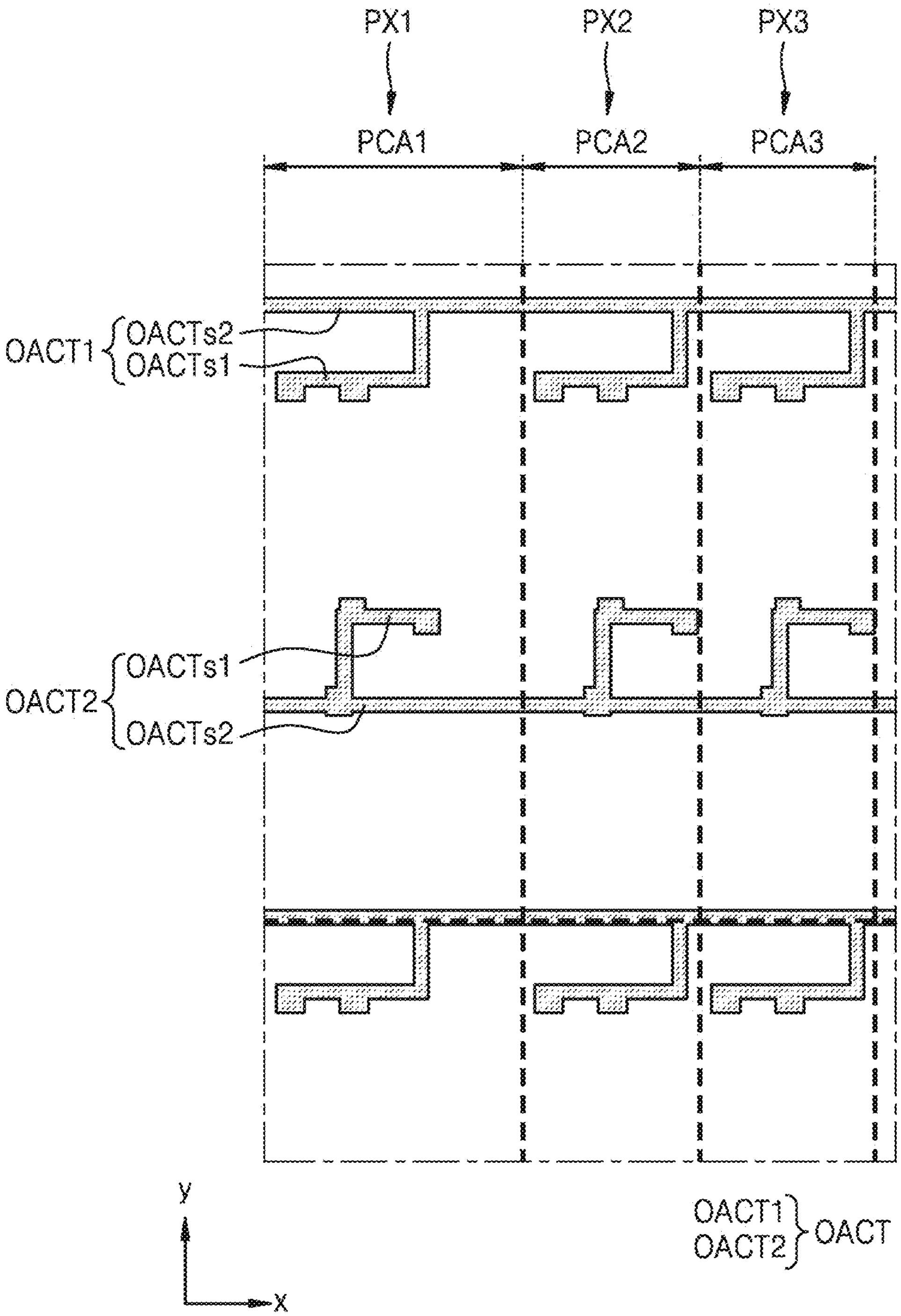

A fourth insulating layer 104 may be disposed on the third insulating layer 103 while covering the third conductive layer. As shown in FIG. 14, a second semiconductor layer OACT including an oxide semiconductor may be disposed on the fourth insulating layer 104. The second semiconductor layer OACT may include a $2^{nd}$-1 semiconductor layer OACT1 and a $2^{nd}$-2 semiconductor layer OACT2.

Each of the $2^{nd}$-1 semiconductor layer OACT1 and the $2^{nd}$-2 semiconductor layer OACT2 may include a first portion OACTs1 having an "L" shape and a second portion OACTs2 extending in the x direction. Respective second portions OACTs2 of the $2^{nd}$-1 semiconductor layers OACT1 of the pixel areas may be connected to each other. Respective second portions OACTs2 of the $2^{nd}$-2 semiconductor layers OACT2 of the pixel areas may be connected to each other. The $2^{nd}$-1 semiconductor layers OACT1 of the pixel areas may be formed integrally. The $2^{nd}$-2 semiconductor layers OACT2 of the pixel areas may be formed integrally.

The second semiconductor layer OACT may include a source region, a drain region, and a channel region between the source region and the drain region of each of the second through fifth transistors T2 through T5.

Referring to FIG. 16, the $2^{nd}$-1 semiconductor layers OACT1 may include a source region S2 and a drain region D2 of the second transistor T2 and a source region S5 and a drain region D5 of the fifth transistor T5. The $2^{nd}$-2 semiconductor layers OACT2 may include a source region S3 and a drain region D3 of the third transistor T3 and a source region S4 and a drain region D4 of the fourth transistor T4.

Figure 15:
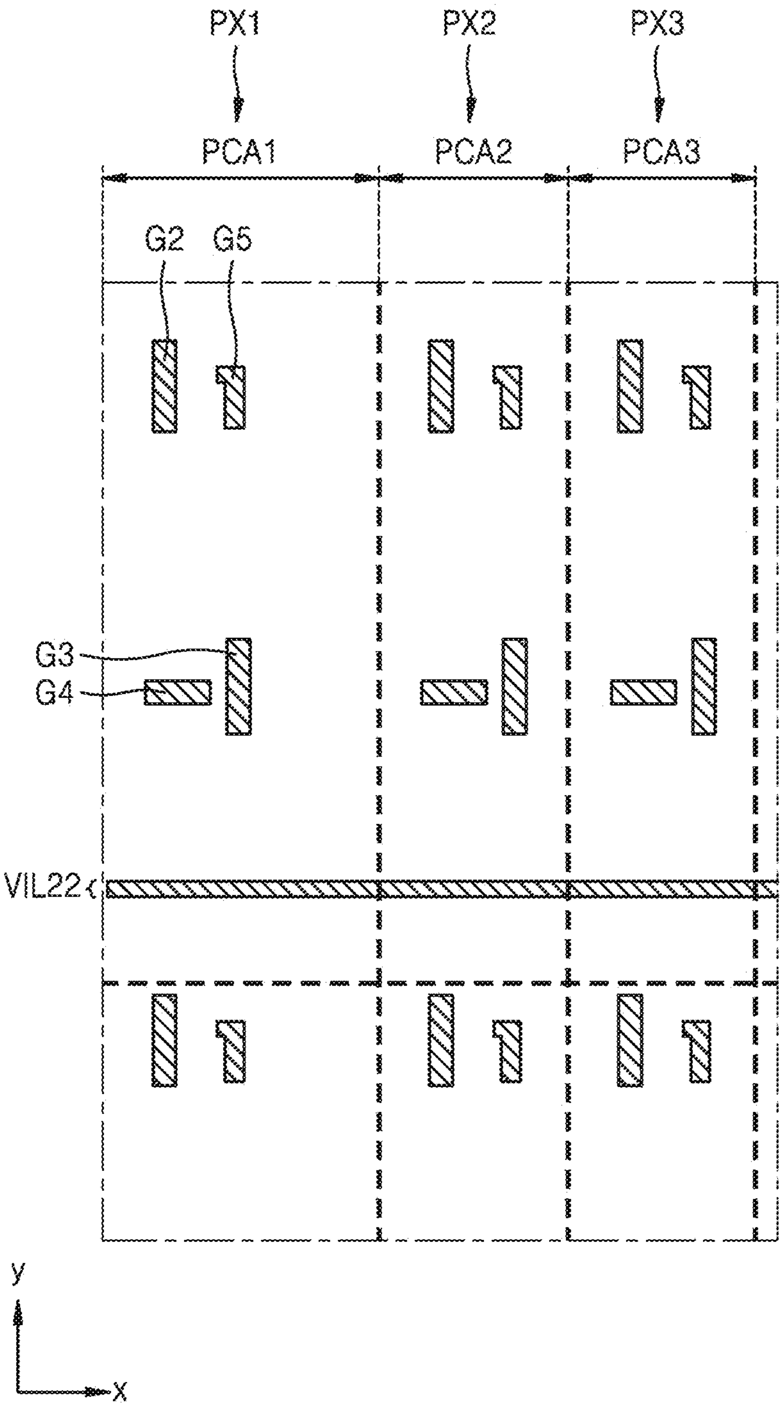

A fifth insulating layer 105 may be disposed on the fourth insulating layer 104 while covering the second semiconductor layer OACT, and a fourth conductive layer may be disposed on the fifth insulating layer 105. As shown in FIG. 15, the fourth conductive layer may include a second gate electrode G2, a third gate electrode G3, a fourth gate electrode G4, a fifth gate electrode G5, and a $2^{nd}$-2 initializing voltage line VIL22.

Each of the second gate electrode G2, the third gate electrode G3, the fourth gate electrode G4, and the fifth gate electrode G5 may be provided in an island type for each pixel area.

Referring to FIG. 16, the second gate electrode G2 may be an upper gate electrode of the second transistor T2. The second gate electrode G2 may overlap the second back gate electrode BG2 and the $2^{nd}$-1 semiconductor layer OACT1. A region of the $2^{nd}$-1 semiconductor layer OACT1 that overlaps the second gate electrode G2 may be the channel region of the second transistor T2.

The third gate electrode G3 may be an upper gate electrode of the third transistor T3. The third gate electrode G3 may overlap the third back gate electrode BG3 and the $2^{nd}$-2 semiconductor layer OACT2. A region of the $2^{nd}$-2 semiconductor layer OACT2 that overlaps the third gate electrode G3 may be the channel region of the third transistor T3.

The fourth gate electrode G4 may be an upper gate electrode of the fourth transistor T4. The fourth gate electrode G4 may overlap the fourth back gate electrode BG4 and the $2^{nd}$-2 semiconductor layer OACT2. A region of the $2^{nd}$-2 semiconductor layer OACT2 that overlaps the fourth gate electrode G4 may be the channel region of the fourth transistor T4.

The fifth gate electrode G5 may be an upper gate electrode of the fifth transistor T5. The fifth gate electrode G5 may overlap the fifth back gate electrode BG5 and the $2^{nd}$-1 semiconductor layer OACT1. A region of the $2^{nd}$-1 semiconductor layer OACT1 that overlaps the fifth gate electrode G5 may be the channel region of the fifth transistor T5.

The $2^{nd}$-2 initializing voltage line VIL22 may extend in the x direction and may be arranged over the first pixel areas PCA1, the second pixel area PCA2, and the third pixel area PCA3.

Figure 17:
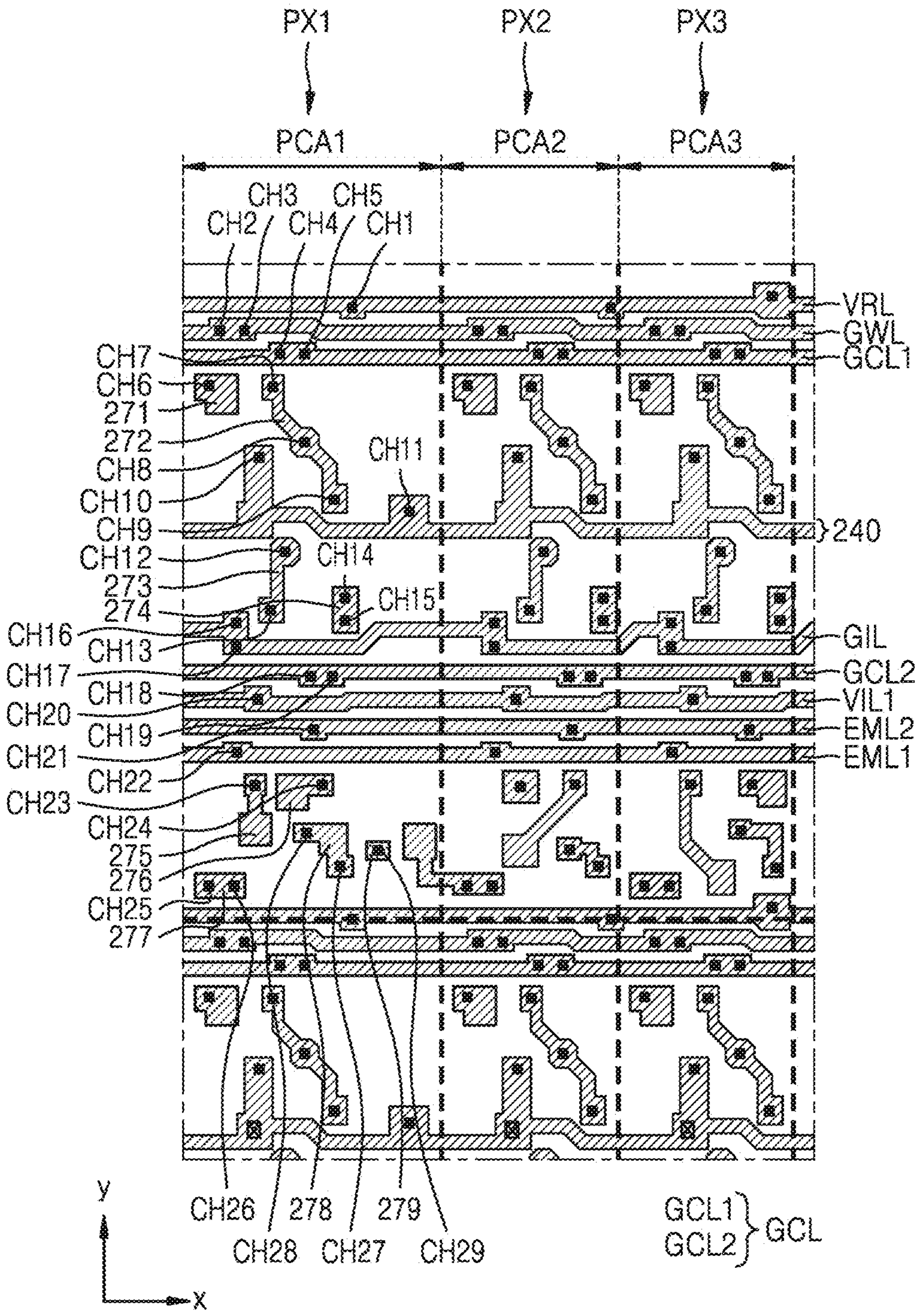

A sixth insulating layer 106 may be disposed on the fifth insulating layer 105 while covering the fourth conductive layer, and a fifth conductive layer may be disposed on the sixth insulating layer 106. As illustrated in FIG. 17, the fifth conductive layer may include a conductive line 240, a first gate line GWL, a second gate line GIL, a third gate line GCL, a fourth gate line EML1, a fifth gate line EML2, a reference voltage line VRL, a first initializing voltage line VIL1, and connection electrodes 271, 272, 273, 274, 275, 276, 277, 278, and 279.

The conductive line 240, the first gate line GWL, the second gate line GIL, the third gate line GCL, the fourth gate line EML1, the fifth gate line EML2, the reference voltage line VRL, and the first initializing voltage line VIL1 may each extend in the x direction and may be arranged over the first pixel areas PCA1, the second pixel area PCA2, and the third pixel area PCA3.

The conductive line 240 may be connected to the conductive line 220 through a contact hole CH10 passing through the fourth insulating layer 104, the fifth insulating layer 105, and the sixth insulating layer 106. The conductive line 240 may be connected to the connection part CNLh through a contact hole CH11 passing through the first insulating layer 101, the second insulating layer 102, the third insulating layer 103, the fourth insulating layer 104, the fifth insulating layer 105, and the sixth insulating layer 106. The conductive line 220 may receive the first power supply voltage ELVDD via the conductive line 240.

The first gate line GWL may be connected to the second back gate electrode BG2 through a contact hole CH2 passing through the fourth insulating layer 104, the fifth insulating layer 105, and the sixth insulating layer 106 in each pixel area, and may be connected to the second gate electrode G2 through a contact hole CH3 passing through the sixth insulating layer 106.

The second gate line GIL may be connected to the fourth back gate electrode BG4 through a contact hole CH16 passing through the fourth insulating layer 104, the fifth insulating layer 105, and the sixth insulating layer 106 in each pixel area, and may be connected to the fourth gate electrode G4 through a contact hole CH17 passing through the sixth insulating layer 106.

The third gate line GCL may include a $3^{rd}$-1 gate line GCL1 and a $3^{rd}$-2 gate line GCL2. The $3^{rd}$-1 gate line GCL1 may be connected to the fifth back gate electrode BG5 through a contact hole CH4 passing through the fourth insulating layer 104, the fifth insulating layer 105, and the sixth insulating layer 106 in each pixel area, and may be connected to the fifth gate electrode G5 through a contact hole CH5 passing through the sixth insulating layer 106. The $3^{rd}$-2 gate line GCL2 may be connected to the third back gate electrode BG3 through a contact hole CH18 passing through the fourth insulating layer 104, the fifth insulating layer 105, and the sixth insulating layer 106 in each pixel area, and may be connected to the third gate electrode G3 through a contact hole CH19 passing through the sixth insulating layer 106.

The fourth gate line EML1 may be connected to the sixth gate electrode G6 through a contact hole CH22 passing through the third insulating layer 103, the fourth insulating layer 104, the fifth insulating layer 105, and the sixth insulating layer 106.

The fifth gate line EML2 may be connected to the seventh gate electrode G7 through a contact hole CH21 passing through the third insulating layer 103, the fourth insulating layer 104, the fifth insulating layer 105, and the sixth insulating layer 106.

The reference voltage line VRL may be connected to the second portion OACTs2 of the $2^{nd}$-1 semiconductor layer OACT1 through a contact hole CH1 passing through the fifth insulating layer 105 and the sixth insulating layer 106. Accordingly, the reference voltage line VRL may be connected to the drain region D5 of the fifth transistor T5.

The first initializing voltage line VIL1 may be connected to the drain region D4 of the fourth transistor T4 through a contact hole CH20 passing through the fifth insulating layer 105 and the sixth insulating layer 106.

The connection electrodes 271, 272, 273, 274, 275, 276, 277, and 278 may be provided in an island type in each pixel area. The connection electrode 279 may be provided in an island type in the first pixel area PCA1.

The connection electrode 271 may be connected to the drain region D2 of the second transistor T2 through a contact hole CH6 passing through the fifth insulating layer 105 and the sixth insulating layer 106.

The connection electrode 272 may be a node electrode corresponding to the fourth node N4. The connection electrode 272 may be connected to the source region S2 of the second transistor T2 and the drain region D5 of the fifth transistor T5 through a contact hole CH7 passing through the fifth insulating layer 105 and the sixth insulating layer 106. The connection electrode 272 may be connected to the second capacitor electrode C12 of the first capacitor C1 through a contact hole CH8 passing through the third insulating layer 103, the fourth insulating layer 104, the fifth insulating layer 105, and the sixth insulating layer 106. The contact hole CH8 may overlap the opening COP1 of the third capacitor electrode C13 of the first capacitor C1 and may be located within the opening COP1. The connection electrode 272 may be connected to the second capacitor electrode C22 of the second capacitor C2 through a contact hole CH9 passing through the fourth insulating layer 104, the fifth insulating layer 105, and the sixth insulating layer 106.

The connection electrode 273 may be a node electrode corresponding to the first node N1. The connection electrode 273 may be connected to the first capacitor electrode C21 of the second capacitor C2 and the first gate electrode G1 through a contact hole CH12 passing through the third insulating layer 103, the fourth insulating layer 104, the fifth insulating layer 105, and the sixth insulating layer 106. The contact hole CH12 may overlap the opening COP2 of the second capacitor electrode C22 of the second capacitor C2 and may be located within the opening COP2. The connection electrode 273 may be connected to the source region S3 of the third transistor T3 and the drain region D4 of the fourth transistor T4 through a contact hole CH13 passing through the fifth insulating layer 105 and the sixth insulating layer 106.

The connection electrode 274 may be connected to the drain region D1 of the first transistor T1 through a contact hole CH14 passing through the second insulating layer 102, the third insulating layer 103, the fourth insulating layer 104, the fifth insulating layer 105, and the sixth insulating layer 106. The connection electrode 274 may be connected to the drain region D3 of the third transistor T3 through a contact hole CH15 passing through the fifth insulating layer 105 and the sixth insulating layer 106.

The connection electrode 275 may be connected to the source region S6 of the sixth transistor T6 through a contact hole CH23 passing through the second insulating layer 102, the third insulating layer 103, the fourth insulating layer 104, the fifth insulating layer 105, and the sixth insulating layer 106.

The connection electrode 276 may be connected to the drain region D7 of the seventh transistor T7 and the source region S8 of the eighth transistor T8 through a contact hole CH24 passing through the second insulating layer 102, the third insulating layer 103, the fourth insulating layer 104, the fifth insulating layer 105, and the sixth insulating layer 106.

The connection electrode 277 may be connected to the source region S9 of the ninth transistor T9 through a contact hole CH25 passing through the second insulating layer 102, the third insulating layer 103, the fourth insulating layer 104, the fifth insulating layer 105, and the sixth insulating layer 106. The connection electrode 277 may be connected to the bias voltage line VBL through a contact hole CH26 passing through the fourth insulating layer 104, the fifth insulating layer 105, and the sixth insulating layer 106.

The connection electrode 278 may be connected to the drain region D8 of the eighth transistor T8 through a contact hole CH27 passing through the second insulating layer 102, the third insulating layer 103, the fourth insulating layer 104, the fifth insulating layer 105, and the sixth insulating layer 106. In the first circuit area PCA1 and the third circuit area PCA3, the connection electrode 278 may be connected to the $2^{nd}$-2 initializing voltage line VIL22 through a contact hole CH28 passing through the sixth insulating layer 106. In the second circuit area PCA2, the connection electrode 278 may be connected to the $2^{nd}$-1 initializing voltage line VIL21 through a contact hole CH28 passing through the fourth insulating layer 104, the fifth insulating layer 105, and the sixth insulating layer 106.

The connection electrode 279 may be connected to the $2^{nd}$-1 initializing voltage line VIL21 through a contact hole CH29 passing through the fourth insulating layer 104, the fifth insulating layer 105, and the sixth insulating layer 106.

A seventh insulating layer 107 may be disposed on the sixth insulating layer 106 while covering the fifth conductive layer, and a sixth conductive layer may be disposed on the seventh insulating layer 107. As shown in FIG. 18, the sixth conductive layer may include vertical conductive lines and connection electrodes 281.

The vertical conductive lines may each extend in the y direction and may be arranged at preset intervals in the x direction. The vertical conductive lines may include a data line DL, a vertical driving voltage line VDLv, a vertical initializing voltage line VIL22*v*, a common voltage line EOL, a vertical bias voltage line VBLv, and a vertical reference voltage line VRLv.

The data line DL may include an odd-number data line DLo and an even-number data line DLe. The odd-number data line DLo and the even-number data line DLe may be arranged in each column. The odd-number data line DLo may be connected to pixels PX arranged in odd-numbered pixel rows of each column. The even-number data line DLe may be connected to pixels PX arranged in even-numbered pixel rows of each column. The odd-number data line DLo and the even-number data line DLe may be spaced apart from each other on one side of each pixel area and arranged in parallel to each other. Odd-number data lines DLo and even-number data lines DLe may be connected to the connection electrode 271 through a contact hole CH31 passing through the seventh insulating layer 107.

Some of the vertical conductive lines may be connected to conductive lines each extending in the x direction (hereinafter, horizontal conductive lines). The horizontal conductive lines may include, for example, the conductive line 240, the $2^{nd}$-2 initializing voltage line VIL22, the bias voltage line VBL, and the reference voltage line VRL.

The vertical driving voltage line VDLv may be connected to the conductive line 240 through a contact hole CH32 passing through the seventh insulating layer 107. The vertical driving voltage line VDLv, the conductive line 240, the conductive line 220, and the conductive line 200, which are arranged on different layers and connected to each other, may be collectively referred to as the driving voltage line VDL that supplies the first driving voltage ELVDD. The driving voltage line VDL may have a mesh structure.

The vertical driving voltage line VDLv may be connected to the connection line 275 through a contact hole CH33 passing through the seventh insulating layer 107. Accordingly, the source region S6 of the sixth transistor T6 may be connected to the driving voltage line VDL to receive the first driving voltage ELVDD.

The vertical initializing voltage line VIL22*v* may be connected to the connection line 278 of the first pixel area PCA1 through a contact hole CH35 passing through the seventh insulating layer 107. Accordingly, because the vertical initializing voltage line VIL22*v* is connected to the $2^{nd}$-2 initializing voltage line VIL22, it may be understood that a voltage line supplying a $2^{nd}$-2 initializing voltage has a mesh structure.

The vertical bias voltage line VBLv may be connected to an extended portion that extends from the connection line 277 of the second pixel area PCA2 to the first pixel area PCA1, through a contact hole CH36 passing through the seventh insulating layer 107. Accordingly, because the vertical bias voltage line VBLv is connected to the bias voltage line VBL, it may be understood that a voltage line supplying the bias voltage VBOS has a mesh structure.

The vertical reference voltage line VRLv may be connected to the reference voltage line VRL through a contact hole CH37 passing through the seventh insulating layer 107. Accordingly, it may be understood that a voltage line supplying the reference voltage VREF has a mesh structure.

The common voltage line EOL may supply the second driving voltage ELVSS and may be connected to the opposite electrode of the organic light-emitting diode OLED in the display area DA and/or the non-display area NDA.

The connection electrode 281 may be connected to the connection electrode 276 through a contact hole CH34 passing through the seventh insulating layer 107.

An eighth insulating layer 108 may be disposed on the seventh insulating layer 107 while covering the sixth conductive layer, and the organic light-emitting diode OLED, which is a display element, may be disposed on the eighth insulating layer 108. The organic light-emitting diode OLED may include a pixel electrode 311, an opposite electrode 315, and an intermediate layer between the pixel electrode 311 and the opposite electrode 315. FIG. 21 illustrates an organic light-emitting diode OLED electrically connected to a pixel circuit of a second pixel PX2 arranged in the second circuit area PCA2.

The pixel electrode 311 may be connected to a connection electrode 281, which is a lower conductive pattern, through a contact hole CH41 passing through the eighth insulating layer 108. As illustrated in FIG. 19, a pixel electrode 311*a* of the first pixel PX1 may be connected to the pixel circuit of the first pixel PX1 by being connected to the connection electrode 281 disposed in the first pixel area PCA1. A pixel electrode 311*b* of the second pixel PX2 may be connected to the pixel circuit of the second pixel PX2 by being connected to the connection electrode 281 disposed in the second pixel area PCA2. A pixel electrode 311*c* of the third pixel PX3 may be connected to the pixel circuit of the third pixel PX3 by being connected to the connection electrode 281 disposed in the third pixel area PCA3.

The pixel electrode 311*a* of the first pixel PX1 and the pixel electrode 311*b* of the second pixel PX2 may be disposed in the first pixel area PCA1. The pixel electrode 311*c* of the third pixel area PX3 may be disposed in the second circuit area PCA2 and the third circuit area PCA3. The pixel electrode 311*c* of the third pixel PX3 may include a first sub-region 311*ca*, a second sub-region 311*cb*, and a third sub-region 311*cc* connecting the first sub-region 311*ca* to the second sub-region 311*cb*.

A ninth insulating layer 109, which is a pixel defining layer covering an edge of the pixel electrode 311, may be disposed above the pixel electrode 311. An opening 109OP extending to a portion of the pixel electrode 311 and defining an emission area may be defined in the ninth insulating layer 109. The ninth insulating layer 109 may be a single or multi-layered organic insulating layer, or a single or multi-layered inorganic insulating layer.

The intermediate layer may include an emission layer 313, a first functional layer below the emission layer 313, or a second functional layer above the emission layer 313. The first functional layer may be a hole transport layer (HTL). In another example, the first functional layer may include a hole injection layer (HIL) and an HTL. The second functional layer may include an electron transport layer (ETL) or an electron injection layer (EIL). The first functional layer and the second functional layer may be integrally formed to correspond to a plurality of organic light-emitting diodes OLED included in the display area DA. The first functional layer or the second functional layer may be omitted.

The opposite electrode 315 may be integrally formed to correspond to a plurality of organic light-emitting diodes OLED arranged in the display area DA.

Figure 22:
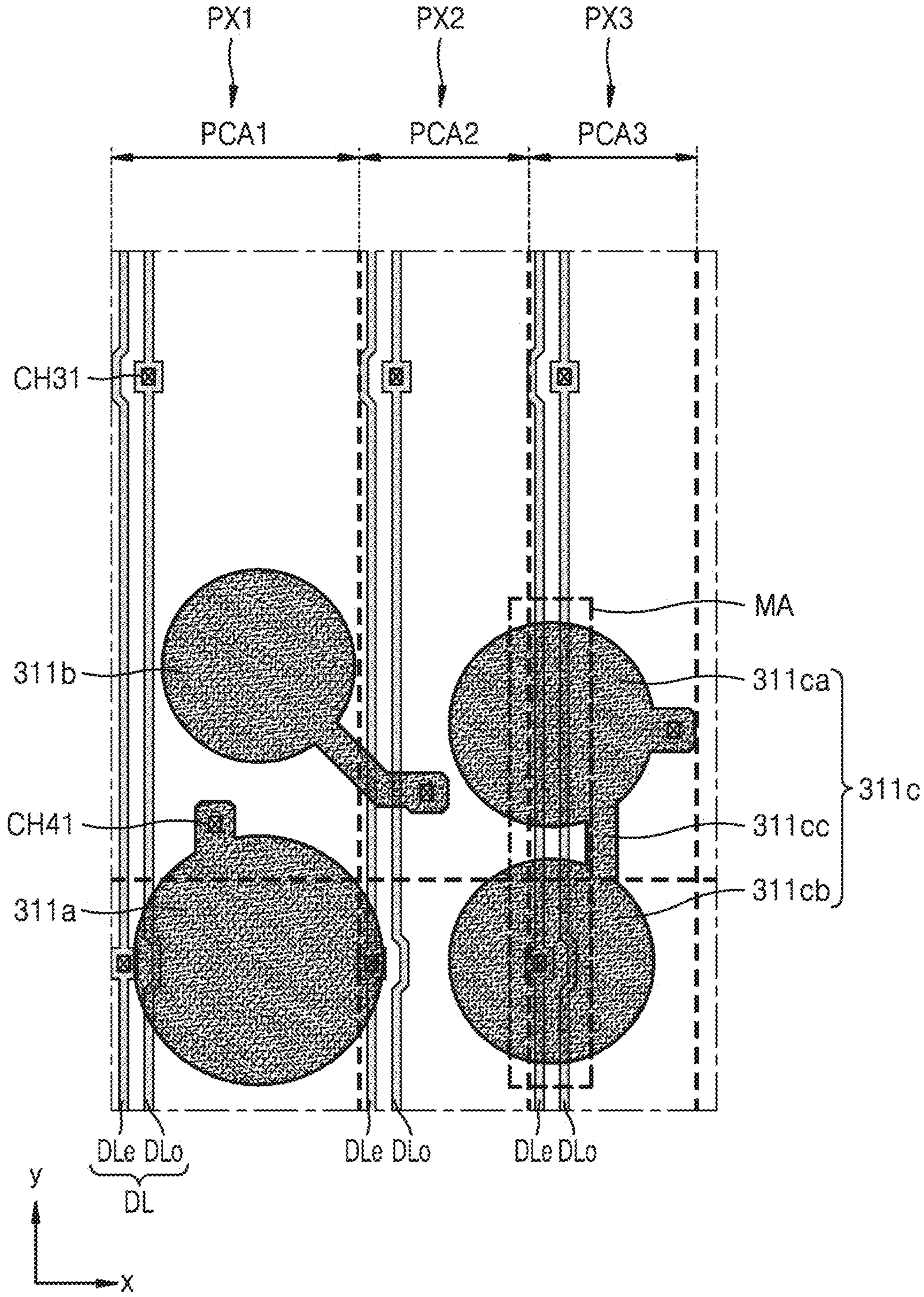
FIG. 22 is a schematic layout view illustrating an arrangement of data lines and pixel electrodes according to an embodiment.

FIG. 22 is a schematic layout view illustrating an arrangement of data lines and pixel electrodes according to an embodiment.

Each of a plurality of pixels may include a pixel circuit and a pixel electrode connected to the pixel circuit. A data line may be connected to each of the plurality of pixels. According to an embodiment, at least one pixel electrode in the plurality of pixels may overlap with a data line among a plurality of data lines. When driving at a low frequency, within one frame, a data signal may be supplied to each pixel once, and a second initializing voltage may be supplied to the pixel electrode of each pixel at least twice.

As illustrated in FIG. 22, an area MA where the pixel electrode 311 and the data line DL overlap each other may be susceptible to the copy mura phenomenon when driven at low frequency. In an embodiment, during one frame, a time taken for a data signal to be supplied to the plurality of pixels once (or a time taken for the first gate signal GW to be supplied to the second transistors T2 of the plurality of pixels once) may be less than or equal to a period during which the second initializing voltage VAINT is supplied to the pixel electrode 311 of each pixel (or a period during which the sixth gate signal GB is supplied to the eighth transistor T8 of each pixel). By setting the scan time of the first gate signal GW in one frame to be less than or equal to the cycle time of the sixth gate signal GB, the copy mura phenomenon that occurs during low-frequency driving may be reduced.

A display apparatus according to some embodiments of the disclosure may be an apparatus displaying a video or a static image, and may visually provide information to a user.

The display apparatus be used as a display screen of various electronic apparatus, such as a television, a notebook computer, a monitor, a broadcasting panel, and an Internet of things (IoT) device, as well as portable electronic devices, such as a mobile phone, a smart phone, a tablet personal computer (PC), a mobile communication terminal, an electronic notebook, an electronic book, a portable multimedia player (PMP), a navigation device, and an ultra-mobile PC (UMPC). Also, the display apparatus according to an embodiment may be used in wearable electronic apparatus, such as a smart watch, a watch phone, a glasses-type display, and a head-mounted display (HMD). Also, the display apparatus according to an embodiment may be used as an electronic apparatus, such as a center information display (CID) on a dashboard of a vehicle or a center fascia or a dashboard of the vehicle, a room mirror display substituting a side-view mirror of a vehicle, or a display disposed on a rear surface of a front seat, as an entertainment device for a backseat of a vehicle. Also, the display apparatus may be a flexible apparatus.

According to embodiments, a display apparatus capable of improving a display quality may be provided. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While the present disclosure has been described with reference to the drawings and embodiments thereof, it will be understood by those of ordinary skill in the art that various changes in form and details may be made thereto without departing from the spirit and scope of the present disclosure as set forth and defined by the following claims.

What is claimed is:

1. A display apparatus comprising:

a plurality of pixels, each of the plurality of pixels including a pixel circuit and a pixel electrode connected to the pixel circuit; and a plurality of data lines respectively connected to the plurality of pixels, wherein at least one pixel electrode in the plurality of pixels overlaps with a data line among the plurality of data lines, a data signal is supplied to each of the plurality of pixels via the plurality of data lines once per one frame, and an initializing voltage is supplied to the pixel electrode in each of the plurality of pixels at least twice per one frame, a time taken for the data signal to be supplied to each of the plurality of pixels during one frame is less than or equal to a period during which the initializing voltage is supplied to the pixel electrode in each of the plurality of pixels during one frame, and during an address scan period in one frame, the data signal is supplied to each of the plurality of pixels before the initializing voltage is supplied to the pixel electrode in each of the plurality of pixels.

2. The display apparatus of claim 1, wherein the plurality of data lines includes first data lines connected to pixels arranged in odd pixel rows and second data lines connected to pixels arranged in even pixel rows, and wherein one of the first data lines and one of the second data lines are arranged adjacent to each other in each pixel column.

3. The display apparatus of claim 1, wherein the pixel circuit comprises:

a driving transistor;

a first transistor connected between a corresponding data line among the plurality of data lines and a gate electrode of the driving transistor, wherein the first transistor is turned on in response to a first gate signal and transmits the data signal from the corresponding data line to a gate of the driving transistor; and a second transistor connected between the pixel electrode and an initializing voltage line to which the initializing voltage is supplied, wherein the second transistor is turned on in response to a second gate signal and transmits the initializing voltage to the pixel electrode.

4. The display apparatus of claim 3, wherein the time taken for the data signal to be supplied to each of the plurality of pixels during one frame is a time during which the first gate signal is supplied to first transistor of each of the plurality of pixels, and wherein the period during which the initializing voltage is supplied to the pixel electrode in each of the plurality of pixels during one frame is a period during which the second gate signal is supplied to the second transistor of each of the plurality of pixels.

5. The display apparatus of claim 3, wherein the driving transistor comprises:

a lower gate electrode supplied with a driving voltage;

an upper gate electrode supplied with a voltage corresponding to the data signal; and a semiconductor layer arranged between the lower gate electrode and the upper gate electrode.

6. The display apparatus of claim 5, wherein the semiconductor layer of the driving transistor comprises a silicon semiconductor.

7. The display apparatus of claim 5, wherein the first transistor comprises:

a lower gate electrode;

an upper gate electrode connected to the lower gate electrode; and a semiconductor layer arranged between the lower gate electrode and the upper gate electrode.

8. The display apparatus of claim 7, wherein the semiconductor layer of the first transistor comprises an oxide semiconductor.

9. A display apparatus comprising:

a plurality of pixels, each of the plurality of pixels including a pixel circuit and a pixel electrode connected to the pixel circuit; and a plurality of data lines respectively connected to the plurality of pixels, wherein at least one pixel electrode in the plurality of pixels overlaps with a data line among the plurality of data lines, wherein a data signal is supplied to each of the plurality of pixels via the plurality of data lines once per one frame, and an initializing voltage is supplied to the pixel electrode in each of the plurality of pixels at least twice per one frame, wherein a time taken for the data signal to be supplied to each of the plurality of pixels during one frame is less than or equal to a period during which the initializing voltage is supplied to the pixel electrode in each of the plurality of pixels during one frame, wherein the pixel circuit comprises:

a driving transistor;

a first transistor connected between a corresponding data line among the plurality of data lines and a gate electrode of the driving transistor, wherein the first transistor is turned on in response to a first gate signal and transmits the data signal from the corresponding data line to a gate of the driving transistor; and a second transistor connected between the pixel electrode and an initializing voltage line to which the initializing voltage is supplied, wherein the second transistor is turned on in response to a second gate signal and transmits the initializing voltage to the pixel electrode, wherein the driving transistor comprises:

a lower gate electrode supplied with a driving voltage;

an upper gate electrode supplied with a voltage corresponding to the data signal; and a semiconductor layer arranged between the lower gate electrode and the upper gate electrode, wherein the first transistor comprises:

a lower gate electrode;

an upper gate electrode connected to the lower gate electrode; and a semiconductor layer arranged between the lower gate electrode and the upper gate electrode, wherein the lower gate electrode of the first transistor is arranged between the upper gate electrode of the driving transistor and the semiconductor layer of the first transistor, and wherein the upper gate electrode of the driving transistor is arranged between the semiconductor layer of the driving transistor and the lower gate electrode of the first transistor.

10. The display apparatus of claim 9, further comprising an electrode layer arranged on a same layer as the lower gate electrode of the first transistor and overlapping the upper gate electrode of the driving transistor.

11. The display apparatus of claim 9, further comprising:

a first electrode layer arranged on a same layer as the lower gate electrode of the driving transistor;

a second electrode layer arranged on a same layer as the upper gate electrode of the driving transistor and overlapping the first electrode layer; and a third electrode layer arranged on a same layer as the lower gate electrode of the first transistor and overlapping the second electrode layer, wherein the first electrode layer and the third electrode layer are supplied with the driving voltage.

12. A display apparatus comprising a plurality of pixels, each of the plurality of pixels comprising:

a light-emitting device;

a first transistor configured to output a driving current to the light-emitting device;

a second transistor connected between a data line and the first transistor, wherein the second transistor is turned on in response to a first gate signal and transmits a data signal from the data line to a gate of the first transistor; and a third transistor connected between the light-emitting device and an initializing voltage line, wherein the third transistor is turned on in response to a second gate signal and transmits an initializing voltage that is supplied through the initializing voltage line to an electrode of the light-emitting device, wherein the first gate signal is supplied to the second transistor in each of the plurality of pixels once per one frame, and the second gate signal is supplied to third transistor in each of the plurality of pixels at least twice per one frame, a time taken for the first gate signal to be supplied to the second transistor in each of the plurality of pixels during one frame is less than or equal to a period during which the second gate signal is supplied to the third transistor in each of the plurality of pixels during one frame, and during an address scan period in one frame, the first gate signal is supplied to the second transistor in each of the plurality of pixels before the second gate signal is supplied to the third transistor in each of the plurality of pixels.

13. The display apparatus of claim 12, further comprising first data lines connected to pixels arranged in odd pixel rows and second data lines connected to pixels arranged in even pixel rows, wherein, one of the first data lines and one of the second data lines are arranged adjacent to each other in each pixel column.

14. The display apparatus of claim 13, wherein the first transistor comprises:

a lower gate electrode supplied with a driving voltage;

an upper gate electrode supplied with a voltage corresponding to the data signal that is supplied through the data line; and a semiconductor layer arranged between the lower gate electrode and the upper gate electrode.

15. The display apparatus of claim 14, wherein the semiconductor layer of the first transistor comprises a silicon semiconductor.

16. The display apparatus of claim 14, wherein the second transistor comprises:

a lower gate electrode;

an upper gate electrode connected to the lower gate electrode; and a semiconductor layer arranged between the lower gate electrode and the upper gate electrode.

17. The display apparatus of claim 16, wherein the semiconductor layer of the second transistor comprises an oxide semiconductor.

18. The display apparatus of claim 16, wherein the lower gate electrode of the second transistor is arranged between the upper gate electrode of the first transistor and the semiconductor layer of the second transistor, and wherein the upper gate electrode of the first transistor is arranged between the semiconductor layer of the first transistor and the lower gate electrode of the second transistor.

19. The display apparatus of claim 18, further comprising an electrode layer arranged on a same layer as the lower gate electrode of the second transistor and overlapping the upper gate electrode of the first transistor.

20. The display apparatus of claim 18, further comprising:

a first electrode layer arranged on a same layer as the lower gate electrode of the first transistor;

a second electrode layer arranged on a same layer as the upper gate electrode of the first transistor and overlapping the first electrode layer; and a third electrode layer arranged on a same layer as the lower gate electrode of the second transistor and overlapping the second electrode layer, wherein the first electrode layer and the third electrode layer are supplied with the driving voltage.

* * * * *